(12) United States Patent
D'Souza et al.

(10) Patent No.: US 7,579,594 B2
(45) Date of Patent: Aug. 25, 2009

(54) INFRARED RADIATION IMAGER HAVING SUB-PIXELIZATION AND DETECTOR INTERDIGITATION

(75) Inventors: Arvind I D'Souza, Anaheim, CA (US); Maryn G Stapelbroek, Santa Ana, CA (US); Larry C Dawson, Huntington Beach, CA (US); Dale E Molyneux, La Habra, CA (US)

(73) Assignee: DRS Sensors & Targeting Systems, Inc., Cypress, CA (US)

( * ) Notice: Subject to any disclaimer, the term of this patent is extended or adjusted under 35 U.S.C. 154(b) by 1 day.

(21) Appl. No.: 12/033,648

(22) Filed: Feb. 19, 2008

(65) Prior Publication Data

US 2008/0135757 A1 Jun. 12, 2008

Related U.S. Application Data

(63) Continuation of application No. 11/206,937, filed on Aug. 17, 2005, now Pat. No. 7,351,972.

(60) Provisional application No. 60/603,017, filed on Aug. 19, 2004.

(51) Int. Cl.
*G01J 5/22* (2006.01)
(52) U.S. Cl. .................................. 250/332; 250/208.1
(58) Field of Classification Search ................. 250/332, 250/208.1
See application file for complete search history.

(56) References Cited

U.S. PATENT DOCUMENTS

| | | | |
|---|---|---|---|
| 5,449,910 A | 9/1995 | Wood et al. | |
| 6,028,309 A | 2/2000 | Parrish et al. | |
| 6,091,280 A | 7/2000 | Hynecek | |
| 6,121,614 A | 9/2000 | Taniguchi et al. | |
| 6,137,107 A | 10/2000 | Hanson et al. | |
| 6,455,931 B1 | 9/2002 | Hamilton et al. | |
| 6,465,784 B1 | 10/2002 | Kimata | |
| 6,593,562 B1 | 7/2003 | Parrish et al. | |
| 6,759,657 B2 | 7/2004 | Iida et al. | |
| 6,770,881 B2 | 8/2004 | Iida et al. | |
| 6,828,642 B2 | 12/2004 | Claiborne et al. | |
| 7,351,972 B2 * | 4/2008 | D'Souza et al. | 250/332 |
| 2002/0148963 A1 | 10/2002 | Claiborne et al. | |
| 2003/0178565 A1 | 9/2003 | Shigenaka et al. | |
| 2004/0121523 A1 | 6/2004 | Nakanishi | |
| 2005/0017176 A1 | 1/2005 | Koch et al. | |

OTHER PUBLICATIONS

Holloway, "Theory of Lateral-Collection Photodiodes"; J. App.. Phys. 49(7); Jul. 1978; pp. 4264-4269.

(Continued)

*Primary Examiner*—David P Porta
*Assistant Examiner*—Shun Lee
(74) *Attorney, Agent, or Firm*—Sonnenschein Nath & Rosenthal LLP

(57) ABSTRACT

An infrared radiation ("IR") focal plane array ("FPA") imager includes a detector array chip containing pixels having substantially one-hundred percent operability. Each of the pixels contains a plurality of interdigitated sub-detectors, where the sub-detectors are selectively operable to provide for collection of photogenerated minority charges representative of all or substantially all of the IR radiation absorbed by the detector array chip of the FPA imager.

12 Claims, 14 Drawing Sheets

OTHER PUBLICATIONS

Stobie, J., et al.; Infrared Spaceborne Remote Sensing X; Proceedings of SPIE; vol. 4818; 2000); pp. 218.
Wijewarnasuriya, P. S. et al.; Journal of Electronic Materials; vol. 28; No. 6; (1999); pp. 649-654.
D'Souza, A. et al.; "Journal of Electronic Materials"; (2000); vol. 29; No. 6; pp. 630-635.

* cited by examiner

Random Number Distribution Test Geometrical Spot ($10^6$ photons)

Random Number Distribution Test Geometric + Diffraction Spot ($10^6$ photons)

INFRARED RADIATION IMAGER HAVING SUB-PIXELIZATION AND DETECTOR INTERDIGITATION

CROSS REFERENCE TO RELATED APPLICATION

This application is a continuation of U.S. Ser. No. 11/206,937 filed Aug. 17, 2005 which claims the benefit of U.S. Provisional Application No. 60/603,017, filed Aug. 19, 2004, assigned to the assignee of this application and incorporated by reference herein.

FIELD OF THE INVENTION

The present invention relates generally to infrared radiation imaging and, more particularly, to an infrared radiation focal plane array imager including pixels containing a plurality of interdigitated sub-detectors that are selectably operable to provide for substantially one hundred percent operability of the imager.

BACKGROUND OF THE INVENTION

Large area focal plane arrays ("FPAs") are used in a variety of infrared radiation ("IR") imaging applications to obtain imaging data having high spatial resolution. An IR imager containing one or more FPAs generates imaging data based on the detection of absorbed IR energy that was emitted or transmitted from a target surface area (scene) facing the FPAs. Large area FPAs are sometimes also incorporated into imaging spectrometer systems to provide both high spatial and high spectral resolution data on an imaged scene.

As is well known in the art, a FPA in a conventional IR imager is in the form of a detector array chip and an associated read-out circuit, and includes a two-dimensional array of pixels arranged in a planar layout on the detector array chip. The pixels correspond to respective geometrical areas on the surface of the detector array chip, and operate as IR radiation detectors that collect the minority charges that are generated in the detector array chip when it absorbs IR radiation supplied from a scene imaged by the FPA. The pixels of the detector array chip collect the minority charges for a predetermined interval, known as an integration time interval, after which the pixels are sampled to ascertain the amount of collected minority charges. After sampling, the pixels are cleared or reset, and then again collect minority charges generated based on the absorption of radiation for another integration time interval. The collection of photogenerated minority charges by the pixels of the detector array chip, and then the sampling and resetting of the pixels by the read-out circuit, are performed iteratively as the FPA images a scene or a sequence of scenes, portion-by-portion.

In many imaging applications, it is desired that an FPA imager detects the absorption of radiation at all portions on the FPA designed to have imaging capabilities, in other words, at all of the pixels of the FPA. If all or substantially all of the pixels of a FPA are operating, the FPA can generate imaging data that represents all or substantially all of the radiation absorbed from the scene being imaged. An imaging apparatus having these operating characteristics is known in the art as a very high operability imager.

Very high operability, long wavelength infrared ("LWIR") imaging spectrometers, which can provide high spatial and high spectral resolution imaging data on a scene based on absorption of LWIR radiation, are desirable for many applications, such as science, missile defense and space surveillance. For example, a LWIR imaging two-dimensional Fourier transform infrared spectrometer ("FTS"), such as a spectrometer having a cutoff wavelength $\lambda_c$ of about 17 µm, having very high operability LWIR FPAs and that can also image a scene over a relatively short time interval, is needed for imaging applications ordinarily performed on a satellite platform. The satellite platform imaging applications, for example, require generation of a sequence of images in synchrony with the movement of the FTS's mirror, where each image is obtained based on the absorption of LWIR radiation by the pixels of the detector array chip, so that high spatial and high spectral resolution atmospheric sounding data can be obtained.

As early prior art IR FPA imagers, which are commonly known as small format FPAs, contained only a small collection of radiation detectors, a large scene was partitioned into multiple portions that the FPA sequentially sampled so that high spatial and high spectral resolution IR imaging data could be obtained. Consequently, the time interval for imaging the entire scene was relatively long, which was undesirable because the resulting imaging data could not accurately capture rapidly changing information contained in the scene. Although small format FPAs can be operated to image larger portions or the entirety of a scene to achieve a shorter interval for imaging the scene, this results in the reduction of spatial resolution, which is undesirable for high resolution imaging applications.

FPAs with increased numbers of pixels, thus, were developed to satisfy the requirements for increased imaging resolution. A preferred, and conventional, prior art method of producing an IR FPA with a large number of pixels is by hybridization, where each pixel of a separately manufactured detector array chip containing a plurality of pixels is coupled by an individual metal column to a silicon read-out integrated circuit ("ROIC") chip. The ROIC includes electrical circuitry that conditions the photogenerated charges collected at minority charge collectors, which are p/n or n/p junction collection diodes formed at the respective pixels, and that transfers data representative of the minority charges collected at the individual pixels to downstream signal processing electronics. The downstream electronics uses the minority charge data to generate corresponding imaging data with high spatial and/or high spectral resolution, such as is required for atmospheric sounding data.

For ease of reference, the construction of a single pixel included in a detector array chip is described below as having a horizontal portion that has length and width dimensions, and a vertical portion extending orthogonally from the horizontal portion and that corresponds to the thickness or depth of the chip. It is to be understood that, in a detector array chip, pixels are typically arranged in a pattern extending horizontally along both the length and width dimensions, where the pattern of the pixels usually is dictated by the specific imaging application. FIG. 1A is a cross-sectional (depth) view of an exemplary prior art pixel 10 having a conventional radiation detector architecture, and FIG. 1B is a top down plan (horizontal) view of the pixel 10 showing only the detector components. FIG. 1A is a cross-sectional view of the pixel 10 taken along line 1A-1A in FIG. 1B. Referring to FIG. 1B, the pixel 10 corresponds to a horizontal portion of a detector array chip (not shown) having a width W and a length L, where W and L are conventional values and can be the same value, such as 120 µm. Referring to FIG. 1A, the pixel 10 includes an implant 12 formed in a base optical energy absorber layer 14 made of p-type or n-type semiconductor material, such as HgCdTe. The absorber layer 14 is formed on a substrate 16, such as CdZnTe. The implant 12 forms a p/n or n/p junction diode by converting a portion of the semiconducting absorber layer 14 to n-type or p-type, respectively. The absorber layer 14 and the substrate 16 extend horizontally on the detector array chip so as to be co-extensive with the horizontal portion of the detector array chip corresponding to the pixel 10. The implant 12 typically extends horizontally over a large fraction, for example 90%, of the horizontal portion of the detector array chip corresponding to the pixel 10. The p/n or n/p junction formed by the implant 12 and absorber layer 14 constitutes a collection diode that functions as the radiation detector for the pixel 10.

Still referring to FIG. 1A, as is well known in the art, in operation IR radiation usually enters the pixel 10 through the substrate 16. The radiation is absorbed in the absorber layer 14, which results in the generation of minority and majority charges. The minority charges diffuse toward and are collected at the p/n or n/p junction that constitutes the collection diode of the pixel 10. As the horizontal portion of the detector array chip over which the implant 12 extends for the pixel 10 is almost co-extensive with the horizontal portion of the detector array chip over which the absorber layer 14 in the pixel 10 extends, there is a high likelihood that the collection diode of the pixel 10, if operable, will collect all or substantially all of the minority charges induced by the IR radiation absorbed by the pixel 10.

Referring again to FIG. 1A, a metal layer 20 overlies the implant 12 and electrically connects the collection diode of the pixel 10 to a metal pad 22. The metal pad 22, which can be an indium bump, facilitates the transfer of the photogenerated minority charges collected at the collection diode to processing components in the ROIC chip portion (not shown) of the FPA imager. In addition, an insulating protective layer 18 overlies portions of the absorber layer 14 that do not contain the implant 12 to avoid shorting of p/n junctions.

Based on the current state of IR FPA technology, when a LWIR detector array chip including the pixels 10 is manufactured using the required p-type and n-type semiconductor materials according to conventional chip manufacturing processes, a significant fraction, typically about 5%-10%, of the collection diodes is inoperable, such that the corresponding pixels 10 are inoperable. Defects created in a detector array chip during deposition of the absorber layer 14 or the manufacture of the detector array chip cause some of the implants 12, and thus the corresponding collection diodes, to be inoperable. If a defect in the detector array chip intersects the p/n or n/p junction forming the collection diode of a pixel, the defect degrades or shorts the p/n or n/p junction. When a collection diode is degraded or shorted, dark current in the collection diode overwhelms the current due to photogenerated minority charges from the absorber layer 14 of the pixel 10, such that the collection diode cannot provide any photogenerated minority charge information for the pixel 10 of the FPA from which imaging data can be derived.

Referring again to FIG. 1B, the implant 12 extends over about 90% of the horizontal portion of the chip corresponding to the pixel 10. As the collection diode for the pixel 10 occupies a very large part of the horizontal portion of the detector array chip corresponding to the pixel 10, there is a high likelihood that the collection diode on the pixel 10, namely the implant 12, will intersect a manufacturing defect in the detector array chip p/n junction area, such that the current collected at the collection diode of the pixel 10 that is based on photogenerated minority charges would be overwhelmed by dark current in the collection diode. Where several of the pixels of an FPA are not operable because their respective collection diodes intersect detector array chip defects, as will likely occur when the FPA includes pixels having the detector architecture of the pixel 10 illustrated in FIGS. 1A and 1B, the FPA cannot generate imaging data that faithfully represents all or substantially all of the radiation supplied from the imaged scene and absorbed in the pixels. In other words, an FPA including inoperable pixels does not produce imaging data representative of the portions of a scene to which the pixels including the inoperable collection diodes correspond. Consequently, an FPA chip including an array of the pixels 10 likely would not have the desired high operability, and thus high spectral and high spatial resolution, that the FPA chip theoretically can achieve, because one or more of the pixels likely would not be operable due to expected manufacturing defects formed in the detector array chip material.

Conventional detector array chip processing techniques cannot be modified to eliminate the creation of defects in the detector array chip during manufacture thereof, without expending substantial additional effort and incurring substantial additional expense. It is known that one cause of the manufacturing defects expected to form in an LWIR detector array chip is a natural result of the growth of absorber materials, such as HgCdTe, on a substrate, such as CdZnTe, because the lattice of the absorber materials does not perfectly match the lattice of the substrate. Although the formation of some defects during the detector array chip growth process can be reduced, it has been found that very costly modifications of the standard detector array chip manufacturing processes achieve only a relatively small percentage reduction in the number of defects formed in LWIR detector array chips. Based on the expected formation of defects in a detector array chip, LWIR detector array chips having many thousands of the pixels 10, and also having very high operability, such as about 99.9% or greater, are nearly impossible to manufacture using conventional chip processing.

Research and development efforts have focused on increasing the operability of LWIR FPAs in view of expected defects in the detector array chip. According to one prior art technique, each of the pixels of a hybrid LWIR FPA including an array of the pixels 10, such as a detector array chip having a 256.times.256 array of the pixels 10, becomes a sub-element of a super-pixel. A super-pixel is formed from four adjoining pixels 10, where each of the pixels includes a single p/n or n/p junction collection diode. See Stobie, James A. et al., SPIE Vol. 4818, pg. 213 (2002), incorporated by reference herein. As the pixels 10 in the FPA chip become sub-elements of a super-pixel, the probability that a sub-element of a super-pixel has a defect is lower than the probability that the single, large super-pixel has a defect. For example, if a pixel is divided into four sub-elements, the probability of any sub-element having a defect is lowered by a factor of four relative to the probability that a single, large pixel has a defect. The ROIC is designed to allow the collection of photogenerated minority charges only from non-degraded or non-shorted sub-elements for each super-pixel. The degraded or shorted sub-elements do not contribute to the overall minority charge collection of the pixel. A disadvantage of this prior art technique, however, is that a loss of signal results for every sub-element that is shorted or degraded. For example, if two sub-elements of a super-pixel have their respective collection diodes intersecting a defect such that the collection diodes are shorter or degraded, the photogenerated minority charges are not collected at the regions of these sub-elements so that as much as 50% of the energy incident on the super-pixel can be lost and, therefore, not accounted for in the imaging data.

In an alternative prior art approach for improving FPA operability, a detector array chip is manufactured using pixels having the lateral collection diode ("LCD") architecture. See H. Holloway, 49 J. Appl. Phys., pg. 4264 (1978), incorporated by reference herein. FIG. 2A is a cross-sectional view of an exemplary prior art pixel 50 having an LCD radiation detector architecture, and FIG. 2B is a top down plan view of the pixel 50 showing only the p/n junction diode components. FIG. 2A is a cross-sectional view of the pixel 50 taken along line 2A-2A in FIG. 2B. Referring to FIG. 2B, the exemplary pixel 50 is shown extending over the same horizontal portion of a detector array chip as the pixel 10 of FIG. 1B to allow for ease of comparison between the detector architectures of the pixels 10 and 50. Referring to FIGS. 2A and 2B, the pixel 50 includes a plurality of p/n collection diodes and, referring to FIGS. 1B and 2B, the horizontal portion of the detector array chip over which each of the implants 12 extends, and thus the horizontally extending p/n junction area of each of the collection diodes, is much reduced in relation to the horizontal portion corresponding to the implant 12 of the pixel 10. Each of the implants 12 in the pixel 50 has a circularly-shaped horizontal portion. In the typical implementation of the pixel 50, the pixel 50 is included in a detector array chip intended for LWIR application, each of the implants 12 has a radius of about 10 μm or less and the W and L dimensions of the pixel 50 range from about 40 μm to about 120 μm. Referring again to FIG. 2B, each of the implants 12 is a sub-element of the pixel 50 and the implants 12 are horizontally spaced apart from one another a distance equal to no more than the diffusion length for the minority charge carriers in the pixel 50. The pixel 50 otherwise has substantially the same construction as the pixel 10, except that the insulating protective layer 18 is interposed between metal contact layer 20 and portions of the absorber layer 14 that do not contain implants 12 to avoid shorting the p-side to the n-side of the p/n junctions. The metal pad 22 overlies the metal contacts 20 and connects the collection diodes in the pixel 50 to one another to form a single, large radiation detector. In operation, the sub-elements of the pixel 50 collect substantially all of the minority charges photogenerated in the absorber layer 14, including those photogenerated between the implants 12. See D'Souza, A. I. et al., 29 J. Electron. Mater., 630 (2000), incorporated by reference herein.

Referring to FIGS. 1B and 2B, the implants 12 of the respective collection diodes in the pixel 50 extend over a much smaller horizontal portion, typically about 10%, of the detector array chip than the horizontal portion of the detector array chip corresponding to the implant 12 in the pixel 10. As a result, the probability that a defect in the semiconductor material of the pixel 50 portion of the detector array chip would intersect the p/n junctions in the pixel 50, so as to short or degrade the collection diodes therein, is reduced by about a factor of 10 relative to the probability that the collection diode of the pixel 10 would intersect a defect. See Wijewarnasuriya, P. S. et al., 28 J. Electron. Mater., p. 649 (1999), incorporated by reference herein.

Although the detector architecture of the pixel 50 improves operability of a FPA including the pixels 50, the guarantee of very high operability, where all pixels in a detector array chip consisting of the pixels 50 are fully operational, however, cannot be made. Defects in the detector array chip still are likely to intersect collection diodes in the pixels 50 and, thus, result in shorted or degraded collection diodes in the pixels 50 for which photogenerated minority charges are overwhelmed by dark current.

It is also known in the art to use a microlens in conjunction with a pixel of an FPA to reduce the size of the horizontal portion of the pixel over which the p/n junction of the collector diode extends. FIG. 3A is a cross-sectional view of an exemplary prior art pixel 100 that includes a microlens 32, and FIG. 3B is a top down plan view of the pixel 100 showing only the p/n junction diode component. FIG. 3A is a cross-sectional view of the pixel 100 taken along line 3A-3A in FIG. 3B. Referring to FIG. 3B, the pixel 100 is shown extending over the same horizontal portion of a detector array chip as the pixels 10 and 50, as shown in FIGS. 1B and 2B, to allow for ease of comparison among the detector architectures of the pixels 10, 50 and 100. Referring to FIGS. 1A, 1B, 3A and 3B, the pixel 100 is similar in construction to the pixel 10, except that a single, smaller sized implant 12 is at the center of the pixel 100 and the microlens 32 covers the horizontal portion of the absorber 14 through which optical energy will enter the pixel 100. Referring to FIG. 3B, the implant 12 in the pixel 100 has a circularly-shaped horizontal portion having a radius of about 30 μm and the pixel 100 preferably has W and L values near or about equal to 120 μm. Like the conventional and LCD detector architectures of the pixels 10 and 50 respectively described above, the use of the microlens 32 in the pixel 100 does not guarantee very high operability for a large detector array consisting of the pixels 100.

Therefore, a need exists for a pixel for use in an IR detector array chip, where the pixel has a detector architecture which provides substantially one-hundred percent operability of the pixels in a large array, where conventional detector array chip processing can be used to manufacture a detector array chip including such high operability pixels and where an FPA imager including a detector array chip formed with such high operability pixels can be sampled at conventional FPA imager sampling rates.

SUMMARY OF THE INVENTION

In accordance with the present invention, a pixel included in a detector array chip of an IR focal plane array ("FPA") imager, such as an LWIR FPA imager, includes a plurality of interdigitated sub-detectors, where each of the sub-detectors includes at least one photogenerated minority charge collector, such as a p/n or n/p junction operating as a collection diode. Each of the sub-detectors in the pixel is selectively operable to operate (i) in a selected mode, in which the collection diode(s) of the selected sub-detector collect(s) photogenerated minority charges; and (ii) in a deselected mode, in which the collection diode(s) of the deselected sub-detector operate(s) as an open circuit. A sub-detector in the pixel is operated in the selected mode if the sub-detector does not include an inoperable collection diode. If the sub-detector includes an inoperable collection diode, the sub-detector is operated in the deselected mode. A sub-detector operating in the deselected mode does not collect photogenerated charges and, furthermore, permits the photogenerated minority charges in the region of the deselected sub-detector to diffuse to the collection diode(s) of a subdetector of the pixel that is (are) adjacent to the collection diode(s) of the deselected sub-detector. The sub-detectors are interdigitated over the horizontal portion of the FPA chip corresponding to the pixel to provide that all or substantially all of the photogenerated minority charges, which are representative of all or substantially all of the radiation absorbed by the pixel, are collected by the selected sub-detector(s) when one or more of the sub-detectors of the pixel are operating in the selected mode. In operation of the pixel, if a first sub-detector is operated in a deselected mode, photogenerated minority charges, which otherwise would have been collected by the first sub-detector if the first sub-detector were operating in the selected mode, are substantially or completely collected by a sub-detector or sub-detectors adjacent to the first sub-detector and operating in the selected mode. The minority charges collected by all of the selected sub-detectors in the pixel are summed, by use of routing switches whose positions are controlled in accordance with those sub-detectors operating in the selected mode, to provide that only a single sample of the pixel is needed to ascertain the sum of the minority charges collected at all of the selected sub-detectors of the pixel for an integration time interval.

In a preferred embodiment, an FPA includes an array of the inventive pixels, and each pixel includes a plurality of selected sub-detectors during operation of the FPA. The charges collected by the selected sub-detectors of the FPA are aggregated to provide that a single sample of each of the pixels of the FPA obtains the minority charge information required for generating imaging data representing all or substantially all of the radiation absorbed by the FPA.

In a preferred embodiment, the positioning of collection diodes of respective sub-detectors in a pixel is determined based on the expected distribution of IR energy over the horizontal portion of the detector array chip corresponding to the pixel; the expected diffusion length of minority charge carriers generated from the absorbed optical energy; and the probability of the collection of the minority charges by the collection diodes, where the probability is a function of the locations of the collection diodes in relation to the locations of optical energy absorption in the pixel.

BRIEF DESCRIPTION OF THE DRAWINGS

Other objects and advantages of the present invention will be apparent from the following detailed description of the presently preferred embodiments, which description should be considered in conjunction with the accompanying drawings in which like references indicate similar elements and in which.

DETAILED DESCRIPTION OF THE INVENTION

Figure 1A:
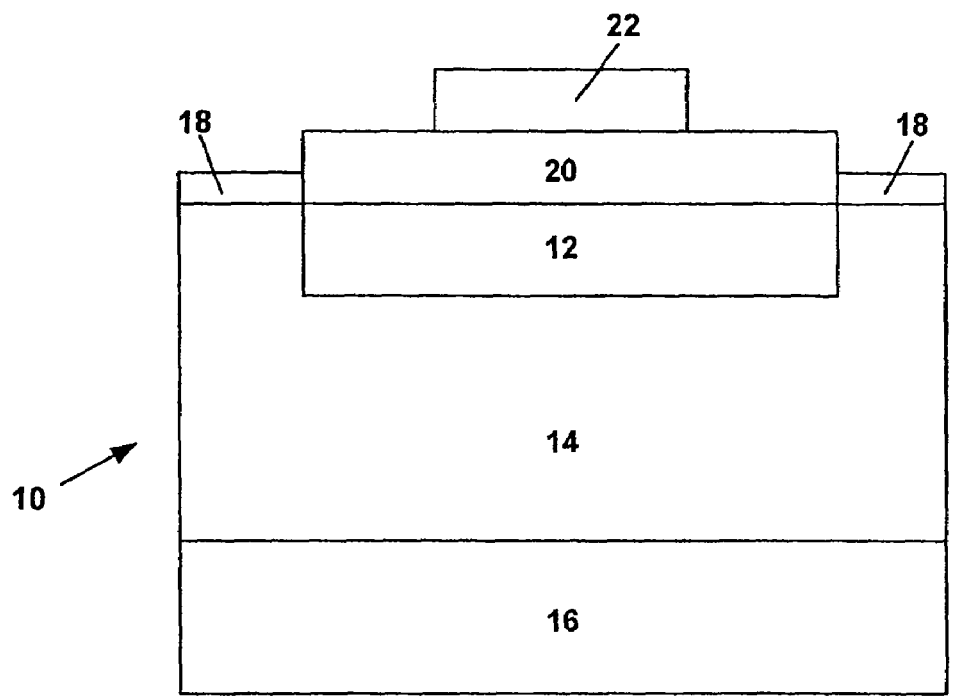
FIG. 1A is a cross-sectional view of a prior art pixel including a conventional detector architecture.
Figure 2A:
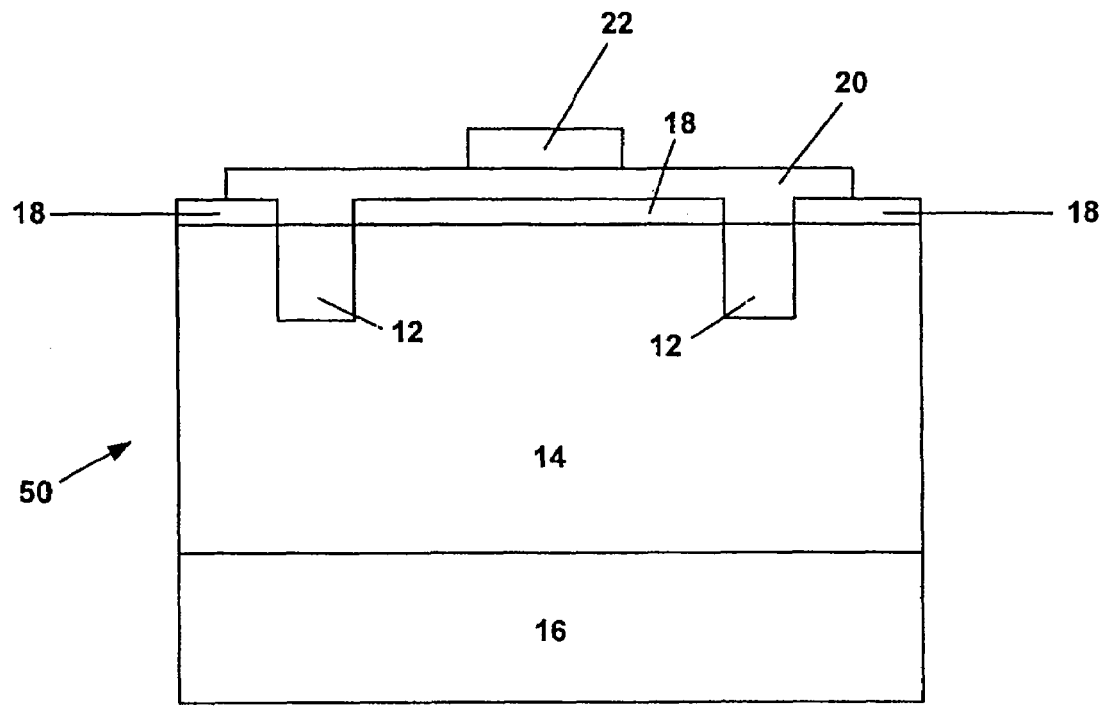
FIG. 2A is a cross-sectional view of a prior art pixel having a lateral collection diode detector architecture.
Figure 3A:
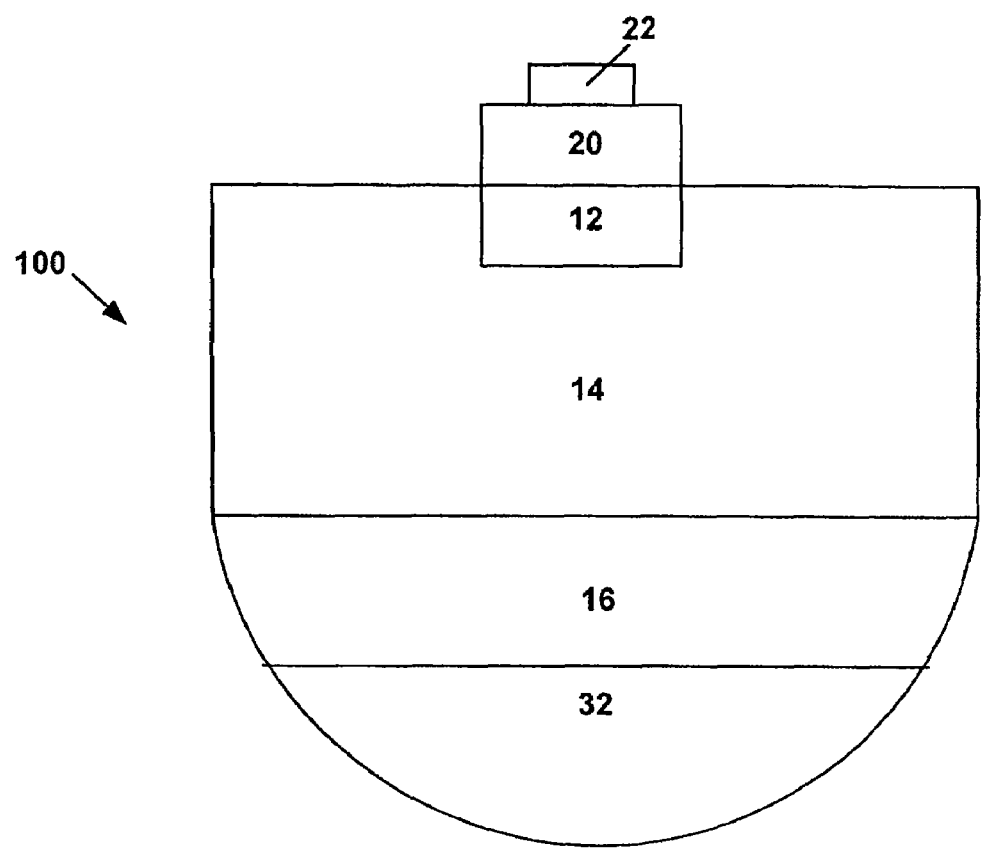
FIG. 3A is a cross-sectional view of a prior art pixel including a microlens.

For highlighting the features and benefits of the present invention, the inventive pixel is described below and illustrated in the drawings as containing a planar arrangement of collection diodes, and metal traces that interconnect individual collection diodes to one another to form interdigitated sub-detectors which are selectively operable. Other components conventionally included in a pixel of a detector array chip and well known in the art, such as shown in FIGS. 1A, 2A and 3A, are omitted from the detailed discussion below and the drawings to provide for clarity and ease of understanding of the features of the inventive pixel. As discussed in detail below, the detector architecture of the inventive pixel advantageously provides that all or substantially all of the minority charges generated in the pixel are collected and that the horizontal portion of a detector array chip over which the inventive detector architecture extends can be the same as, or even smaller than, the horizontal portion of a detector array chip over which the detector architecture of a prior art pixel extends.

Figure 1B:
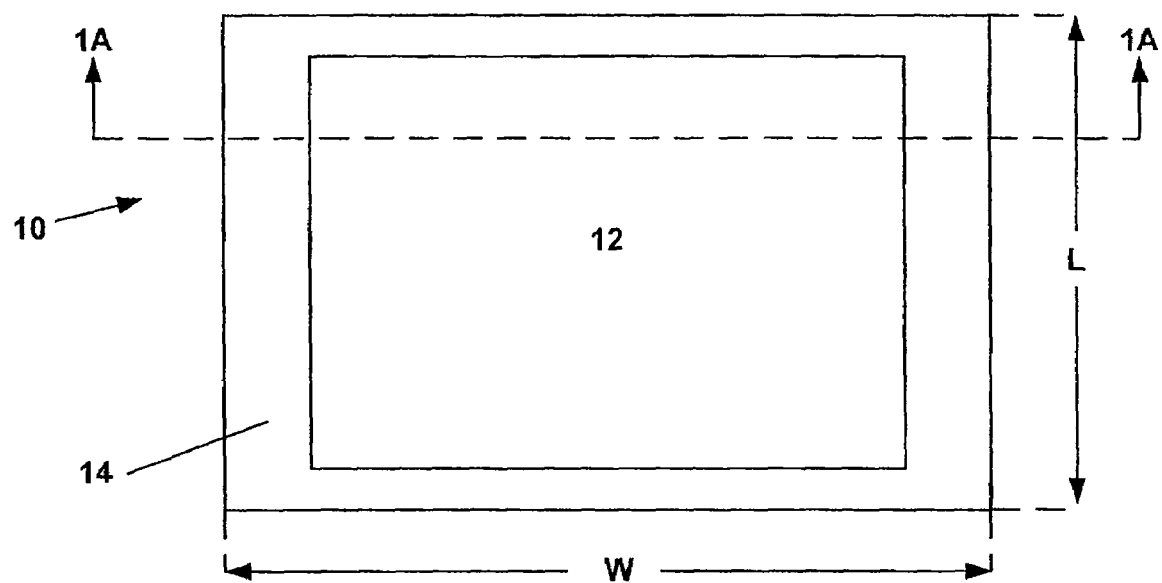
FIG. 1B is a top down plan view of selected components of the pixel of FIG. 1A.
Figure 2B:
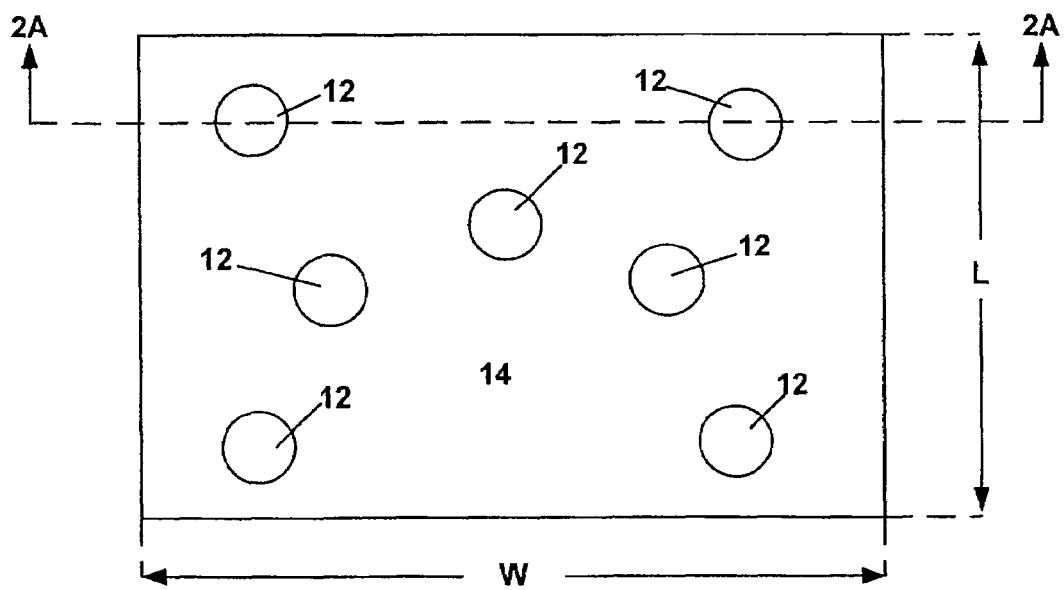
FIG. 2B is a top down plan view of selected components of the pixel of FIG. 2B.
Figure 3B:
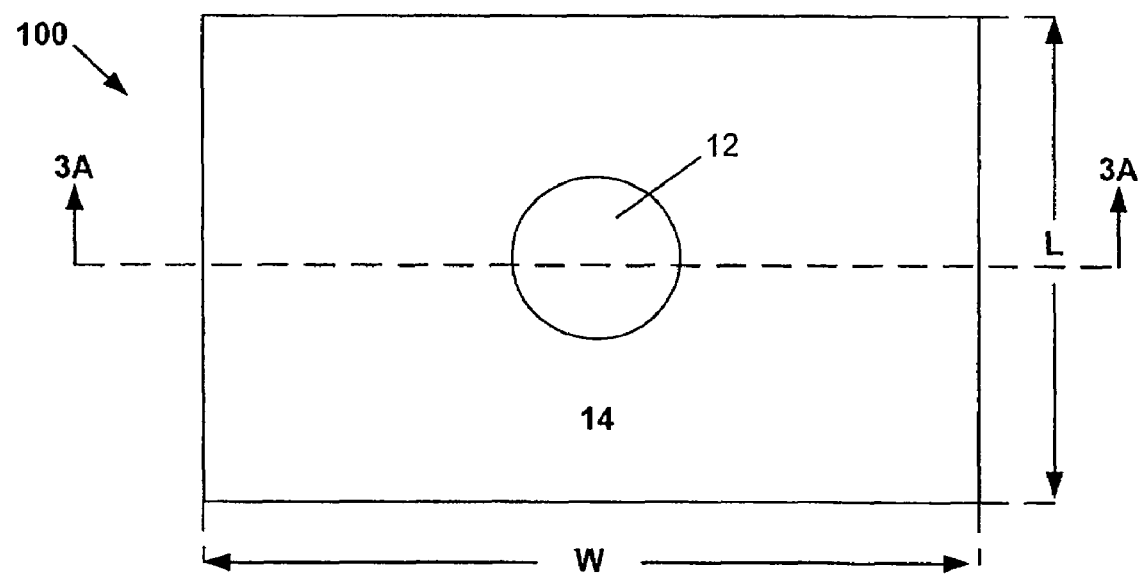
FIG. 3B is a top down plan view of selected components of the pixel of FIG. 3A.
Figure 4:
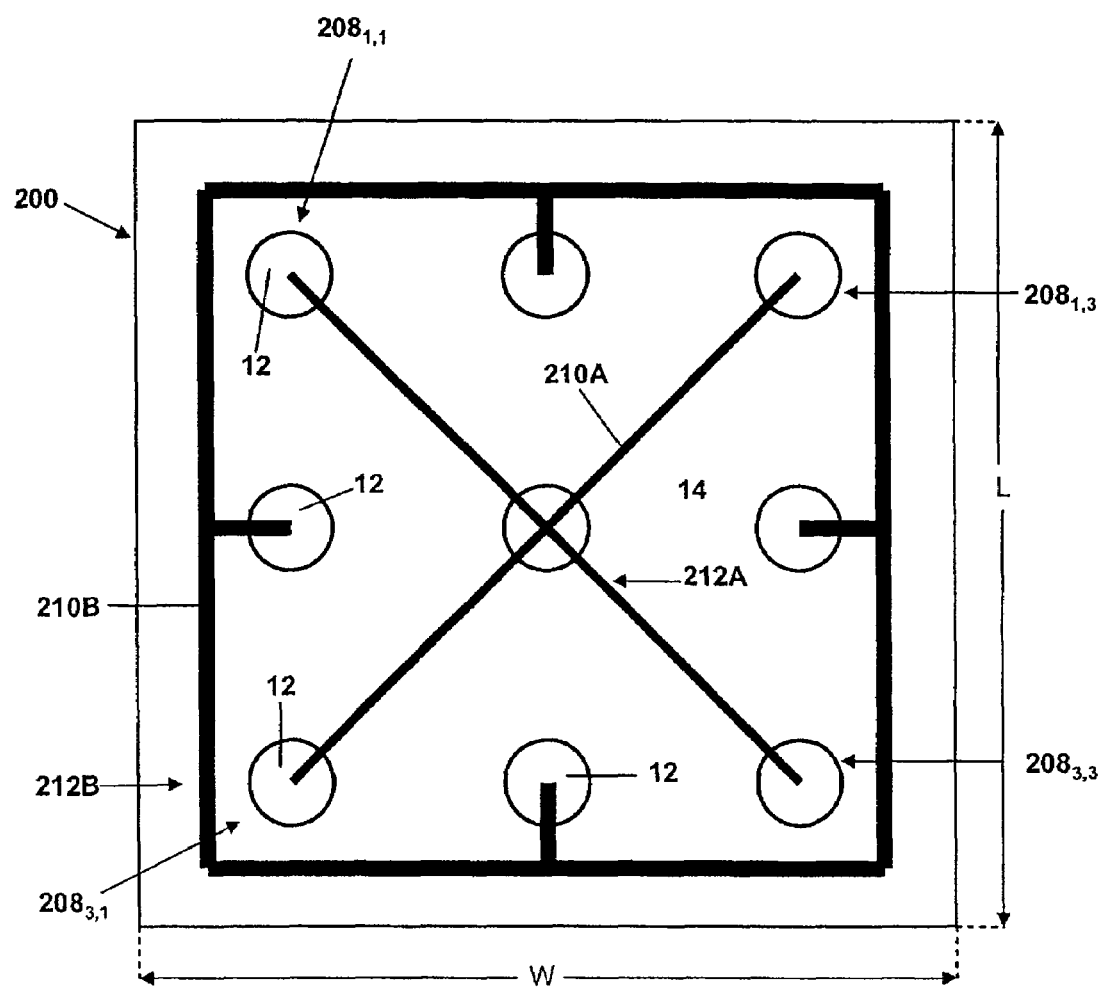
FIG. 4 is a top down plan view of a pixel including two interdigitated sub-detectors in accordance with a preferred embodiment of the present invention.

FIG. 4 is a top down plan view of a detector architecture in a preferred pixel 200 in accordance with the present invention. For purposes of illustrating the advantages of the inventive pixel 200, the horizontal portion of a detector array chip to which the pixel 200 in FIG. 4 corresponds is shown to have the same dimensions as the horizontal portion of a detector array chip corresponding to each of the prior art pixels 10, 50 and 100 described above with reference to FIGS. 1B, 2B and 3B, respectively. Referring to FIG. 4, the pixel 200 includes an n-type or p-type semiconductor material base absorber layer 14 having a plurality of p-type or n-type semiconductor implants 12, respectively. The absorber layer 14 is co-extensive with the horizontal portion of a detector array chip corresponding to the pixel 200. The implants 12 define substantially circularly-shaped portions on the horizontal portion of the detector array chip having a radius of less than about 10 μm. The junctions of the absorber layer 14 and the implants 12 constitute p/n or n/p junction collection diodes 208. The p/n junction collection diodes 208 are, for example, of the type included in an LCD architecture, as discussed above with respect to FIGS. 2A and 2B.

The collection diodes 208 in the pixel 200 are interconnected to one another by metal traces 210 to form interdigitated sub-detectors 212. The sub-detectors 212 are selectively operable to provide that all or substantially all of the minority charges generated from radiation absorbed in the pixel 200 are collected at the selected sub-detector(s) 212 and, thus, provide that the pixel 200 has substantially one-hundred percent operability. Referring again to FIG. 4, the pixel 200 includes metal traces 210A and 210B that are each a part of a single metal layer in the detector array chip that is selectively deposited over the absorber layer 14 and the implants 12 and insulated from the unimplanted portions of the absorber layer 14 by an insulating layer (not shown). The metal traces 210A and 210B, which are formed using conventional, well known in the art photolithographic chip processing techniques, include portions that extend horizontally across the pixel 200 above the implants 12 and the absorber 14, and leg portions (not shown) that extend vertically downward to and contact underlying collection diodes 208. Each of the metal traces 210A and 210B electrically interconnects a plurality of the collection diodes 208 to form the sub-detectors 212A and 212B, respectively. As required by the present invention, any collection diode contained in a first sub-detector of an inventive pixel, such as any collection diode 208 in the pixel 200 included in a first sub-detector 212, is not included in another sub-detector of the pixel, such as in another sub-detector 212 of the pixel 200.

In accordance with the present invention, the interdigitation of the sub-detectors in a pixel provides that photogenerated minority charges generated anywhere within the pixel are collected by sub-detector(s) within the pixel that do not include a collection diode that contains a short or is degraded. Any sub-detector containing an inoperable collection diode of the pixel is disconnected, in other words allowed to float electronically, so that the collection diode(s) of the sub-detector do (does) not remove charges from the absorber layer of the pixel. As a disconnected sub-detector does not remove any minority charges, only the sub-detector(s) that do not contain shorted or degraded collection diodes, which have a very high likelihood of being adjacent to a sub-detector containing a shorted or degraded collection diode, collect all or substantially all of the photogenerated minority charges corresponding to the IR radiation absorbed in the pixel.

The positioning of the collection diodes contained within the respective sub-detectors of a pixel in accordance with the present invention is preferably determined based on one or more of the following considerations: the expected diffusion length of the minority charge carriers; the expected distribution of optical energy over the horizontal portion of the detector array chip corresponding to the pixel; the absorption coefficient for the radiation to be absorbed by the absorbing layer of the pixel; the thickness of the absorbing layer of the pixel; the perfection of the surfaces at the top and bottom of the absorbing layer (the surface recombination velocity); and the probability of the collection of the minority charges by the collection diodes, which is a function of the locations of the collection diodes in relation to the locations of optical energy absorption in the pixel. In a preferred embodiment, the collection diodes of a first sub-detector in a pixel are spaced from the collection diodes of an adjoining sub-detector by substantially less than the diffusion length of the minority charge carriers.

In the preferred embodiment illustrated in FIG. 4, the pixel 200 includes a 3.times.3 array of the collection diodes $208_{(1,1)}$, $208_{(1,2)}$, ... $208_{(3,3)}$ which are selectively interconnected to one another to form the interdigitated sub-detectors 212A and 212B. It is to be understood that the pixel 200 can have a different n.times.m array of collection diodes 208, as suitable, for collecting minority charges using a plurality of interdigitated sub-detectors in accordance with the present invention. Referring to FIG. 4, the sub-detector 212A includes the collection diodes 208 located at the center and corners of the 3.times.3 array, namely, the collection diodes $208_{(1,1)}$, $208_{(1,3)}$, $208_{(2,2)}$, $208_{(3,1)}$ and $208_{(3,3)}$. The sub-detector 212B includes all of the other collection diodes, namely, the collection diodes $208_{(1,2)}$, $208_{(2,1)}$, $208_{(2,3)}$ and $208_{(3,2)}$.

Each of the sub-detectors 212 in the pixel 200 is also connected to conventional electronics (not shown) that provide that a sub-detector 212 can be selectively operated in a selected mode or a deselected mode. In the selected mode, the collection diodes 208 of the selected sub-detector 212 operate to collect minority charges that are formed based on the absorption of IR energy in the absorber layer 14 and reach the collection diodes 208 of the selected sub-detector 212. In the deselected mode, the collection diodes 208 of the deselected sub-detector 212 are placed in the open or float condition, such that the collection diodes 208 of the deselected sub-detector 212 cannot collect photogenerated minority charges and permit the diffusion of photogenerated charges to the collection diode(s) of a selected sub-detector. As discussed above, whether a collection diode actually collects minority charges generated in an absorber layer of a pixel, assuming the collection diode is operating, depends upon such factors as the diffusion length of the minority charge carriers, the expected distribution of optical energy on the pixel, the absorption coefficient of the absorber layer for the impinging energy, the thickness of the absorbing layer and the perfection of the surfaces at the top and bottom of the absorbing layer (the surface recombination velocity).

In operation of the pixel 200, an interdigitated sub-detector 212 is deselected when, following manufacture of the FPA, degraded performance or a short in one of the collection diodes of the sub-detector 212 is identified. Whether a sub-detector 212 of the pixel 200 includes a collection diode that is shorted or degraded can be readily determined from conventional FPA testing procedures. For example, an FPA having a detector array containing a plurality of the pixels 200 can be tested by selecting all of the sub-detectors 212A and deselecting all of the sub-detectors 212B, which would provide for identification of all of the sub-detectors 212A that contain at least one degraded or shorted collection diode. Reversing the selections of the sub-detectors 212 would provide for identification of all of the sub-detectors 212B containing a degraded or shorted collection diode. The short, for example, may be caused by a defect formed in the absorber layer or implant semiconductor materials from which the collection diodes are created during manufacture of the detector array chip.

In accordance with the present invention, the interdigitation of the sub-detectors 212 over the horizontal portion of the detector array chip corresponding to the pixel 200, and the ability to select which of the sub-detectors 212 operate to collect minority charges, provides that, if a first of the sub-detectors is deselected, then the adjacent sub-detector, namely, the collection diodes 208 of the adjacent sub-detector, collects substantially all or all of the photogenerated charges that otherwise would have been collected by the first sub-detector if the first sub-detector were selected. Referring to FIG. 4, if the sub-detector 212A is deselected, for example because one of its collection diodes intersects a defect in the detector array chip, and the sub-detector 212B is selected as would be highly likely in an implementation of the FPA chip in an IR imager, then the collection diodes $208_{(1,2)}$, $208_{(2,1)}$, $208_{(2,3)}$ and $208_{(3,2)}$ of the sub-detector 212B collect all or substantially all of the minority charges generated in the pixel 200 based on absorption of radiation in the absorber layer 14.

Thus, the present invention of a pixel including individually selectable, interdigitated sub-detectors, where each of the sub-detectors includes at least one collection diode, minimizes the size of the horizontal portion of a detector array chip over which the collection diodes extend while compensating for defects in the chip that can cause a collection diode to be inoperable. A pixel in accordance with the present invention, such as the pixel 200, preferably is used to form a pixel array in a LWIR FPA imager. The imager has substantially one hundred percent operability, because there is a very high likelihood that each pixel of the FPA is operable. The aggregation of the minority charges collected at the selected sub-detectors for each of the pixels of the FPA permits a high frame sampling rate for the FPA, because only a single sample is required to determine the amount of photogenerated charges collected at each pixel of the FPA for an integration time interval.

It is has been determined that the number of interdigitated sub-detectors included in an inventive pixel, where such pixel is used to form a two-dimensional pixel array in a LWIR FPA chip, affects operability of the LWIR FPA chip in accordance with the following relationship concerning operability and failure, which assumes that the defects are small and randomly distributed:

FPA Operability=1−(expected defect probability)$^{Number\ of\ interdigitated\ sub\text{-}detectors\ in\ a\ pixel}$ (1)

Thus, higher operability can be obtained in a large array by providing pixels with a larger number of sub-detectors. Referring to the interdigitated sub-detector 212 configuration of the pixel 200 illustrated in FIG. 4, and assuming a 5% expected defect probability in the manufacture of a LWIR FPA chip including an array of the pixels 200, it is expected that the FPA operability would be about 99.75%.

Figure 5:
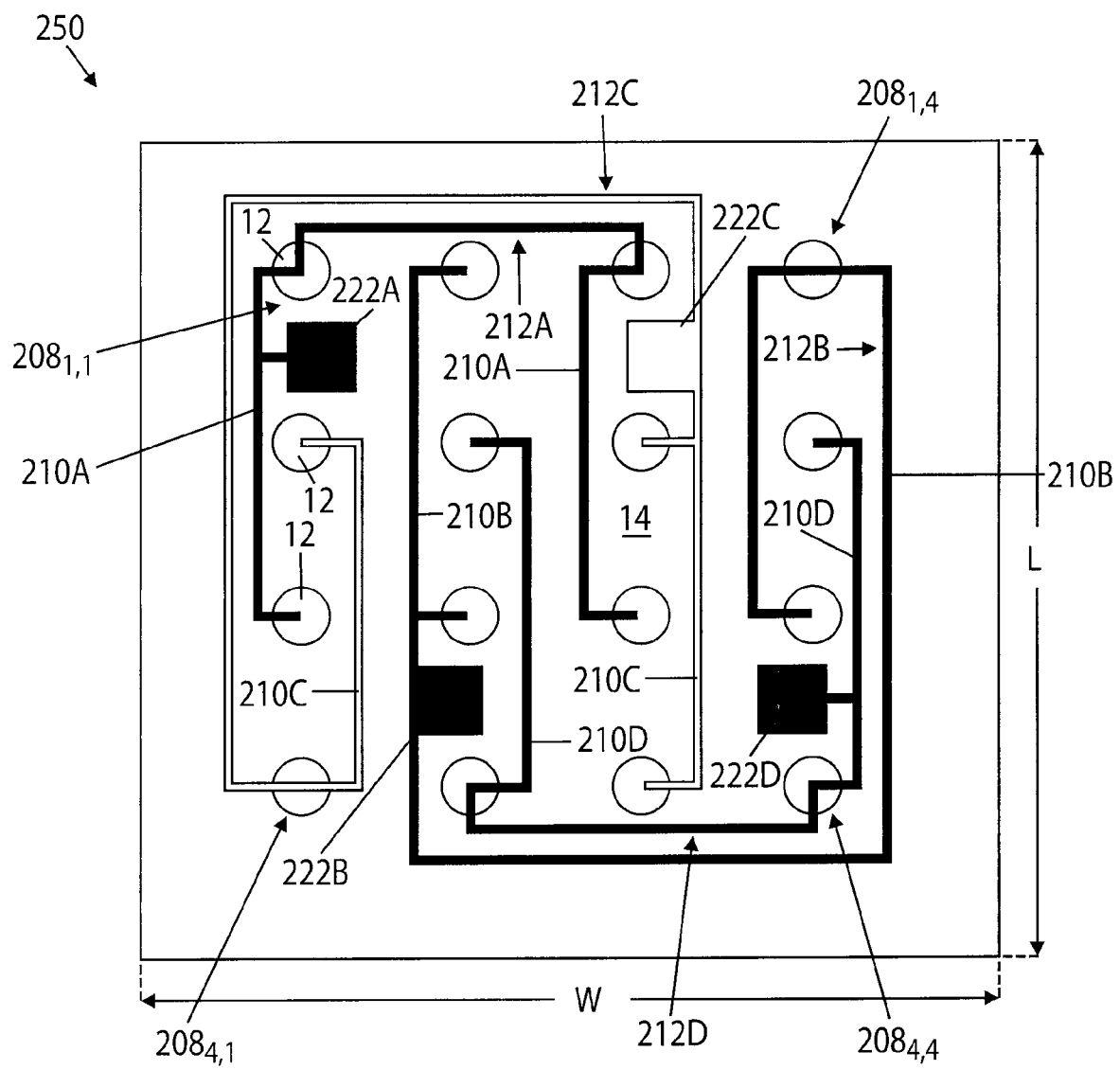
FIG. 5 is a top down plan view of a pixel including four interdigitated sub-detectors in accordance with another preferred embodiment of the present invention.

FIG. 5 is a top down plan view of a preferred embodiment of a pixel 250 including four interdigitated sub-detectors 212A, 212B, 212C and 212D in accordance with the present invention. A LWIR FPA chip having four interdigitated sub-detectors per pixel increases the probability of having at least one or more sub-detectors operable, and consequently increases overall FPA operability with minimal or no decrease in the number of photogenerated minority charges collected by each pixel as long as at least one sub-detector is operated in the selected mode.

Referring to FIG. 5, the pixel 250, which extends over a horizontal portion of a detector array chip having the same dimensions as the pixel 200, includes a 4.times.4 array of collection diodes $208_{(1,1)}$, $208_{(1,2)}$, ... $208_{(4,4)}$. The pixel 250 includes metal traces 210A-210D and metal (indium bump) landing pads 222A-222D that are associated respectively with the interdigitated sub-detectors 212A-212D. The metal traces 210 are part of a single layer of metal that is insulated from the absorber layer 14 and placed in contact with the implants 12 during manufacture of an FPA chip including the pixels 250. As conventional in an FPA imager, the pads 222 electrically connect the respective interdigitated sub-detectors 212, via the traces 210, to a ROIC. The sub-detector 212A includes the trace 210A which is electrically connected to the collection diodes $208_{(1,1)}$, $208_{(3,1)}$, $208_{(1,3)}$ and $208_{(3,3)}$; the sub-detector 212B includes the trace 210B which is electrically connected to the collection diodes $208_{(1,2)}$, $208_{(3,2)}$, $208_{(1,4)}$ and $208_{(3,4)}$; the sub-detector 212C includes the trace 210C which is electrically connected to the collection diodes $208_{(2,1)}$, $208_{(4,1)}$, $208_{(2,3)}$ and $208_{(4,3)}$; and the sub-detector 212D includes the trace 210D which is electrically connected to the collection diodes $208_{(2,2)}$, $208_{(4,2)}$, $208_{(2,4)}$ and $208_{(4,4)}$.

Referring to Equation (1) above, if a 5% expected defect probability is again assumed in the manufacture of an FPA chip including a detector array of the pixels 250, the expected FPA operability would be about 99.9994%, which is an improvement over the FPA operability of an FPA chip formed from the pixels 200.

In another preferred embodiment, a pixel includes at least four interdigitated sub-detectors and each of the sub-detectors is formed from metal traces of a plurality of metal layers which interconnect with a plurality of collection diodes. The inventive pixel including a plurality of metal layers can be manufactured using conventional detector array chip fabrication processes.

Figure 6A:
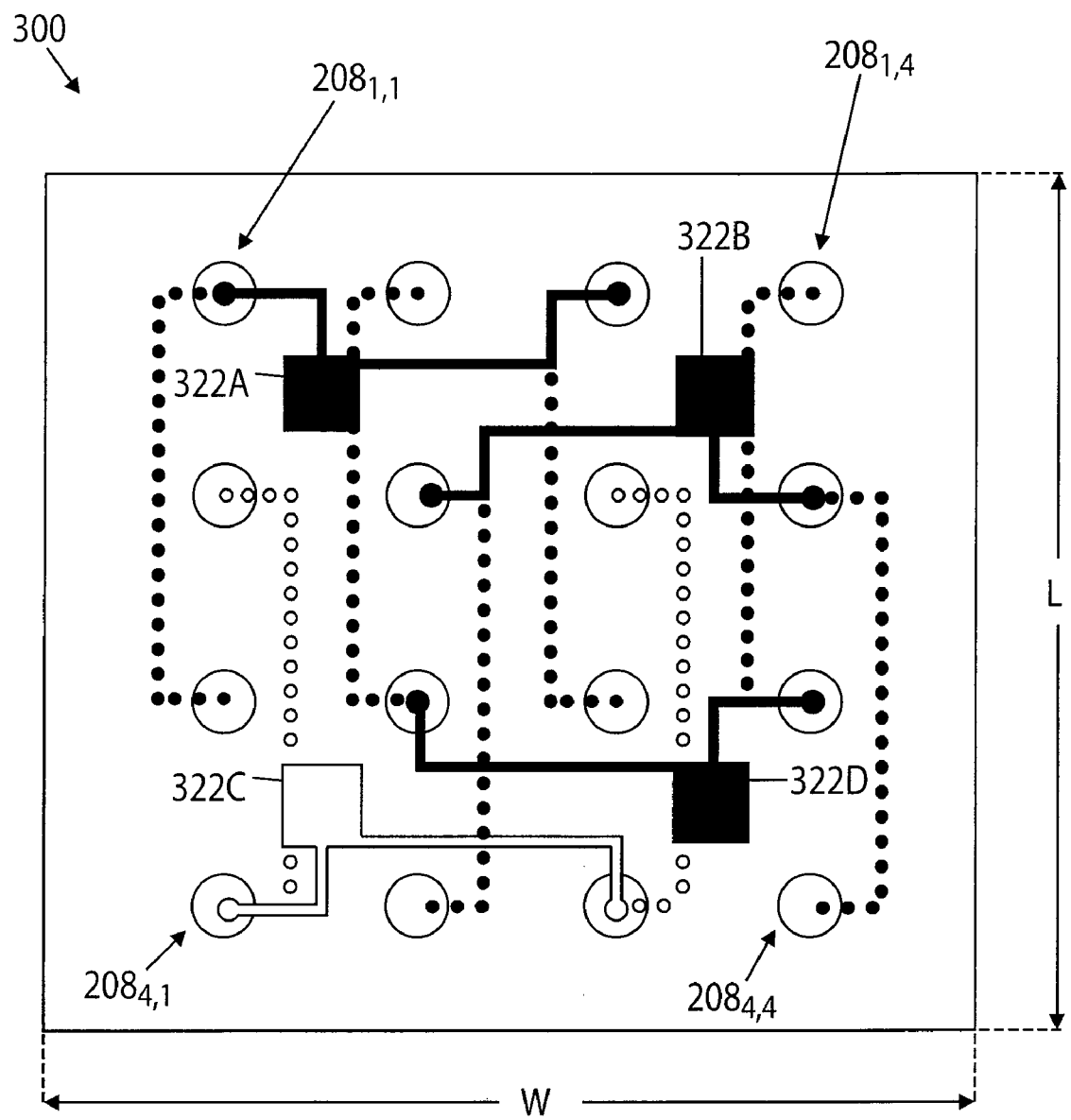
FIG. 6A is a top down plan view of a pixel including four interdigitated sub-detectors formed using two layers of metal in accordance with another preferred embodiment of the present invention.
Figure 6B:
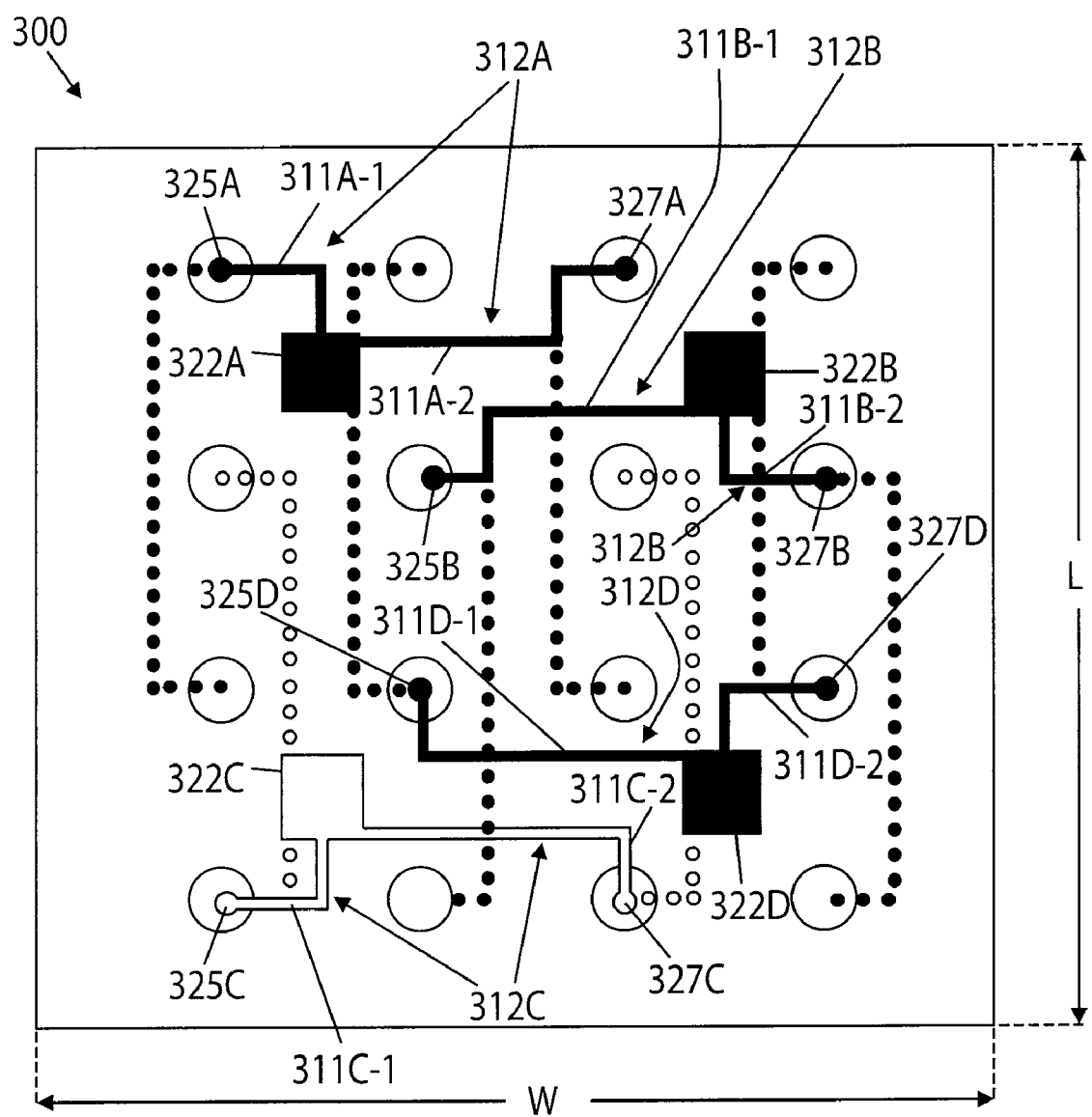
FIG. 6B is a top down plan view of first metal layer interconnections with the collection diodes of the sub-detectors of the pixel of FIG. 6A.
Figure 6C:
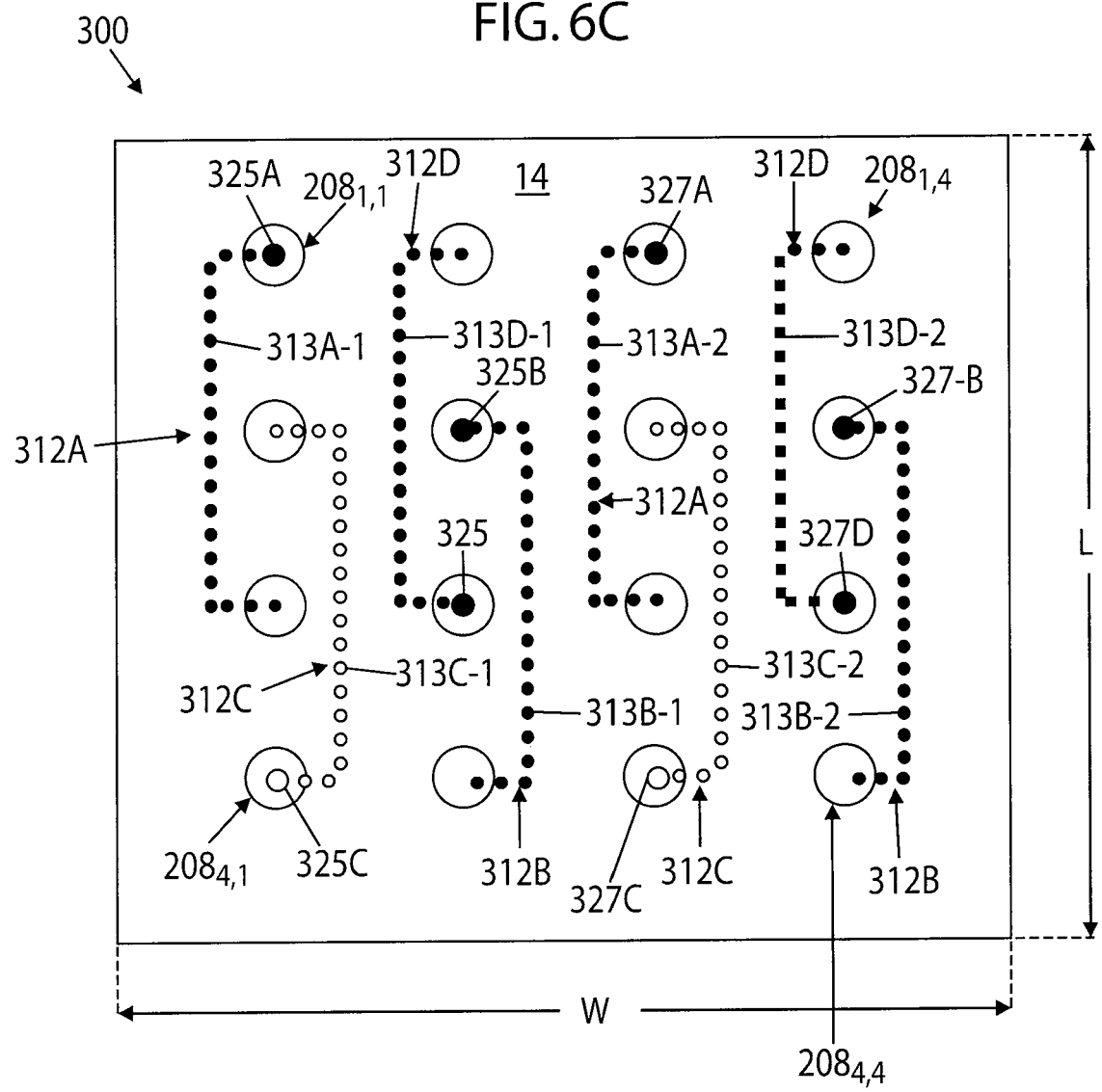
FIG. 6C is a top down plan view of second metal layer interconnections with the collection diodes of the sub-detectors of the pixel of FIG. 6A.

FIGS. 6A, 6B and 6C are top down plan views of a preferred pixel 300, in accordance with the present invention, including four interdigitated sub-detectors 312A-312D formed from collection diodes 208 of a 4.times.4 array of collection diodes 208 and metal traces formed from portions of a metal layer 311 and a metal layer 313. FIG. 6B illustrates the layout of the metal traces of the metal layer 311 in the pixel 300 and pads 322 that overlie and connect to underlying traces of the layer 311. FIG. 6C illustrates the layout of the metal traces of the metal layer 313 in the pixel 300, and the interconnections of the metal traces of the layer 313 to the underlying collection diodes 208 and to the overlying metal traces of the layer 311. FIG. 6A is the portion of the pixel 300 layout shown in FIG. 6B transposed over the portion of the pixel 300 layout shown in FIG. 6C. For ease of reference and description of the pixel 300, the collection diodes 208 of the 4.times.4 array are identified as collection diodes $208_{(1,1)}$, $208_{(2,1)}$, ... $208_{(4,4)}$; the traces formed from the metal layer 311 are designated as traces 311A-311D to correspond to the respective sub-detectors 312A-312D formed with the traces 311A-311D; and the traces formed from the metal layer 313 are designated as traces 313A-313D to correspond to the respective sub-detectors 312A-312D formed with the traces 313A-313D.

Referring to FIGS. 6A, 6B and 6C, the sub-detector 312A is formed in the pixel 300 from the interconnection of the traces 311A and 313A to each other and to the diodes $208_{(1,1)}$, $208_{(3,1)}$, $208_{(1,3)}$ and $208_{(3,3)}$ as follows. Traces 311A-1 and 311A-2 extend from the pad 322A to, respectively, a point above the diode $208_{(1,1)}$ and a point above the diode $208_{(1,3)}$. The opposing ends of the trace 311A terminate in legs 325A and 327A that extend vertically downward and contact underlying traces 313A-1 and 313A-2. Referring to FIG. 6C, the trace 313A-1 extends linearly between the diode $208_{(1,1)}$ and the diode $208_{(3,1)}$, and the trace 313A-2 extends linearly between the diode $208_{(1,3)}$ and the diode $208_{(3,3)}$. The opposing ends of the traces 313A-1 and 313A-2 terminate in legs (not shown) that extend vertically downward and contact the underlying diodes $208_{(1,1)}$, $208_{(3,1)}$, $208_{(1,3)}$ and $208_{(3,3)}$.

Referring to FIGS. 6A, 6B and 6C, the sub-detector 312B is formed in the pixel 300 from the interconnection of the traces 311B and 313B to each other and to the diodes $208_{(2,2)}$, $208_{(4,2)}$, $208_{(2,4)}$ and $208_{(4,4)}$ as follows. Traces 311B-1 and 311B-2 extend from the pad 322B to, respectively, a point above the diode $208_{(2,2)}$ and a point above the diode $208_{(2,4)}$. The opposing ends of the trace 311B terminate in legs 325B and 327B that extend vertically downward and contact underlying traces 313B-1 and 313B-2, respectively. Referring to FIG. 6C, the trace 313B-1 extends linearly between the diode $208_{(2,2)}$ and the diode $208_{(4,2)}$, and the trace 313B-2 extends linearly between the diode $208_{(2,4)}$ and the diode $208_{(4,4)}$. The opposing ends of the traces 313B-1 and 313B-2 terminate in legs (not shown) that extend vertically downward and contact the underlying diodes $208_{(2,2)}$, $208_{(4,2)}$, $208_{(2,4)}$ and $208_{(4,4)}$.

Referring again to FIGS. 6A, 6B and 6C, the sub-detector 312C is formed in the pixel 300 from the interconnection of the traces 311C and 313C to each other and to the diodes $208_{(2,1)}$, $208_{(4,1)}$, $208_{(2,3)}$ and $208_{(4,3)}$ as follows. Traces 311C-1 and 311C-2 extend from the pad 322C to, respectively, a point above the diode $208_{(4,1)}$ and a point above the diode $208_{(4,3)}$. The opposing ends of the trace 311C terminate in legs 325C and 327C that extend vertically downward and contact underlying traces 313C-1 and 313C-2, respectively. The trace 313C-1 extends linearly between the diode $208_{(2,1)}$ and the diode $208_{(4,1)}$, and the trace 313C-2 extends linearly between the diode $208_{(2,3)}$ and the diode $208_{(4,3)}$. The opposing ends of the traces 313C-1 and 313C-2 terminate in legs (not shown) that extend vertically downward and contact the underlying diodes $208_{(2,1)}$, $208_{(4,1)}$, $208_{(2,3)}$ and $208_{(4,3)}$ to establish an electrical connection thereto.

Referring again to FIGS. 6A, 6B and 6C, the sub-detector 312D is formed in the pixel 300 from the interconnection of the traces 311D and 313D to each other and to the diodes $208_{(1,2)}$, $208_{(3,2)}$, $208_{(1,4)}$ and $208_{(3,4)}$ as follows. Traces 311D-1 and 311D-2 extend from the pad 322D to, respectively, a point above the diode $208_{(3,2)}$ and a point above the diode $208_{(3,4)}$. The opposing ends of the trace 311D terminate in legs 325D and 327D that extend vertically downward and contact underlying traces 313D-1 and 313D-2, respectively. The trace 313D-1 extends linearly between the diode $208_{(1,2)}$ and the diode $208_{(3,2)}$, and the trace 313D-2 extends linearly between the diode $208_{(1,4)}$ and the diode $208_{(3,4)}$. The opposing ends of the traces 313D-1 and 313D-2 terminate in legs (not shown) that extend vertically downward and contact the underlying diodes $208_{(1,2)}$, $208_{(3,2)}$, $208_{(1,4)}$ and $208_{(3,4)}$.

Thus, the pixel 300 includes four sub-detectors 312A-312D extending over the same horizontal portion of a detector array chip as the pixel 250, and interdigitated in the same manner as the four sub-detectors 212 are interdigitated in the pixel 250, except that the metal trace interconnections to the collection diodes 208 in the pixel 300 to obtain the sub-detectors 312 are formed using two metal layers 311 and 313.

Figure 7A:
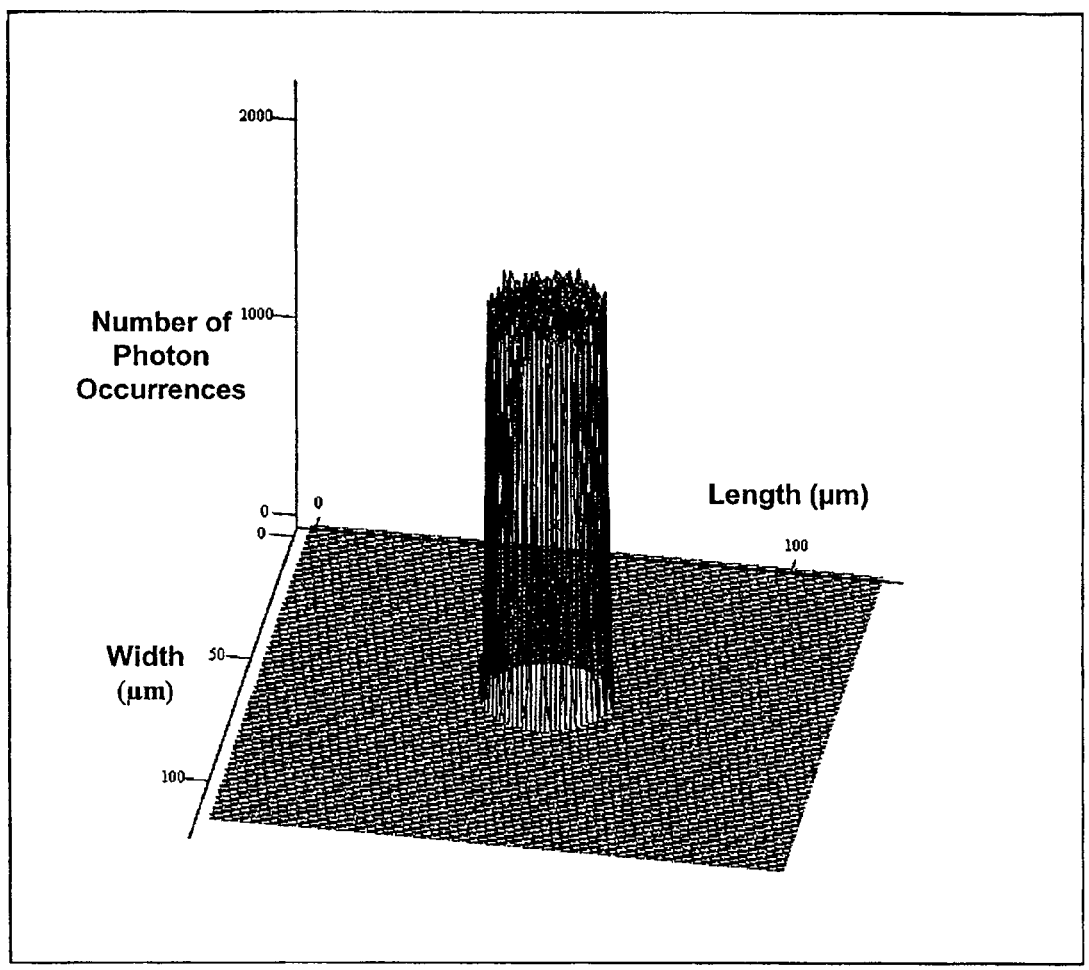
FIGS. 7A, 7B and 7C are histograms showing expected distributions of radiation on the absorber layer of a pixel including a microlens.
Figure 7B:
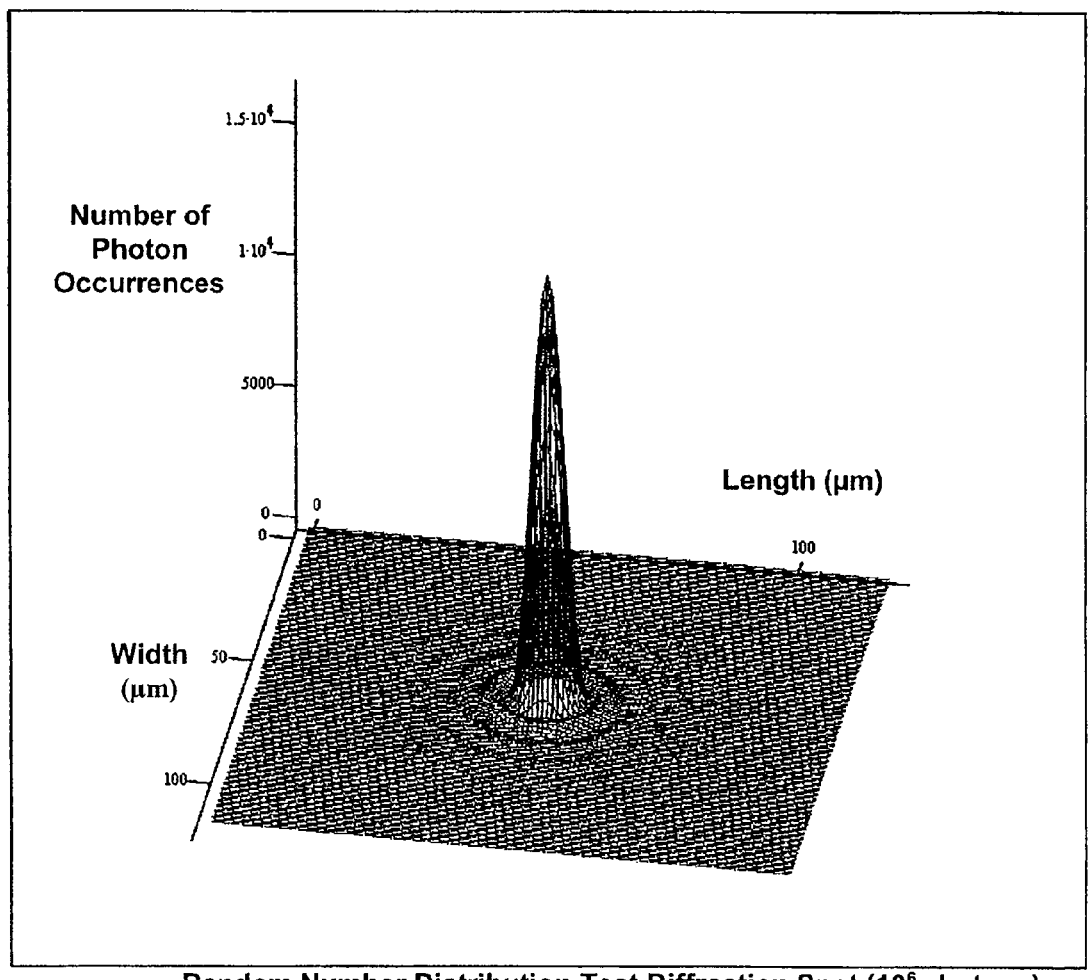
Figure 7C:
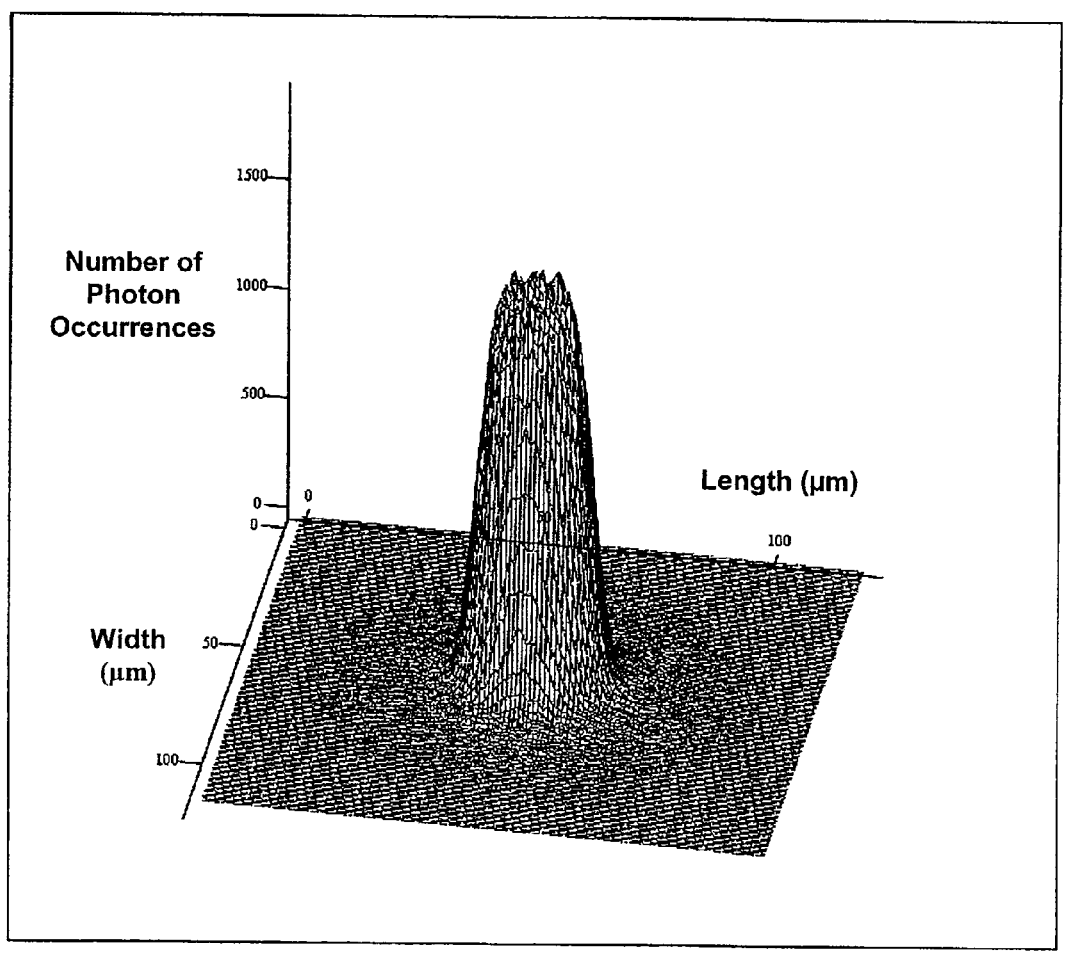

In a further embodiment of the present invention, a pixel having a microlens, such as the pixel 100 of FIGS. 3A and 3B, includes a plurality of interdigitated sub-detectors. In a microlens pixel architecture, it is expected that most of the optical energy impinging the pixel will be absorbed at a relatively small, localized central region of the pixel. FIGS. 7A, 7B and 7C are histograms showing expected distributions of number of photon occurrences on a horizontal portion of a detector array chip corresponding to a pixel including a microlens, where the pixel has width and length dimensions of about 108 μm. The expected distributions were calculated based on the generation of $10^6$ randomly-generated photon arrival examples, which simulates the randomness normally expected for photon events. FIG. 7A illustrates the expected random distribution of photons on the pixel obtained by simulating placement of the microlens in the optical system of an instrument as a field lens, such that the microlens forms a geometrical image of the entrance pupil of the optical system. FIG. 7B shows the expected diffraction effects for the same pixel obtained by simulating a finite aperture for the microlens and where the microlens structure is approximated using a circular aperture. FIG. 7C shows the expected distribution of photon energy on the horizontal portion of the pixel resulting from the combination of the distribution and diffraction spot effects illustrated in FIGS. 7A and 7B. As seen in FIGS. 7A-7C, radiation impinging a microlens pixel is expected to be absorbed in an approximately circularly-shaped region that is centered at the center of the microlens pixel. Based on the expected distribution of radiation impinging on the horizontal portion of the detector array chip corresponding to the microlens pixel, sub-detectors are arranged in an interdigitated configuration on a microlens pixel, in accordance with the present invention, to maximize collection of minority charges by the pixel.

Figure 8A:
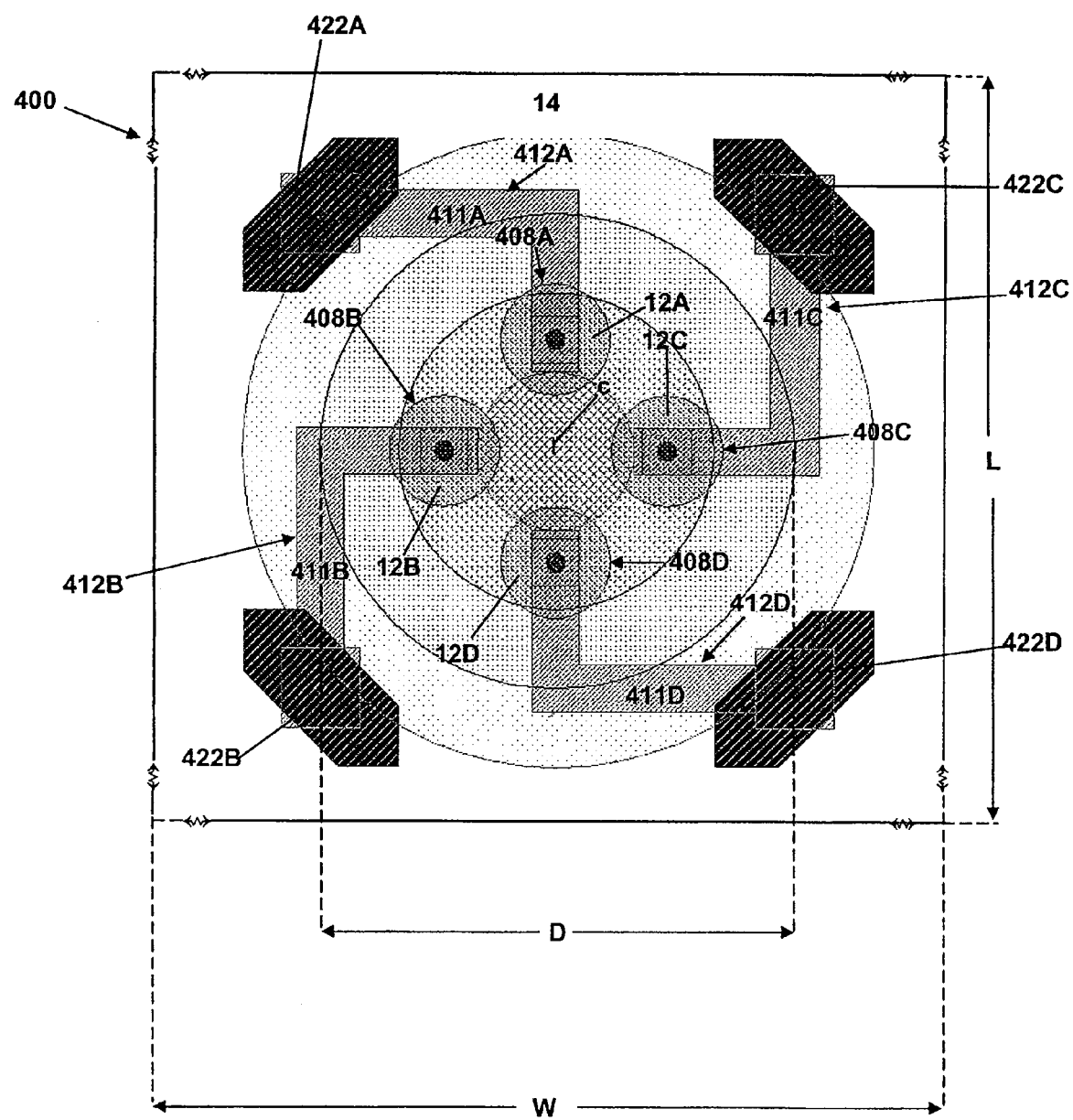
FIG. 8A is a top down plan view of a pixel including four interdigitated sub-detectors in accordance with a preferred embodiment of the present invention.

FIG. 8A is a top down plan view of a preferred microlens pixel 400, in accordance with the present invention, including four interdigitated sub-detectors 412A-412D. The pixel 400 receives optical energy through a microlens (not shown), such as described above for the pixel 100, and the sub-detectors 412 are interdigitated in accordance with the expected locations on the pixel 400 that the optical energy focused by the microlens would be absorbed. Referring to FIG. 8A, the pixel 400 includes four implants 12A-12D in the absorber layer 14 and corresponds to a horizontal portion of a detector array chip (not shown), where the horizontal portion has a width W and a length L and where each of W and L is about 120 μm. The implants 12 define circularly-shaped regions on the pixel 400 having a radius of about 10 μm. Each of the four implants 12 is at the same radial distance from the center C of the pixel 400 and circumferentially spaced equidistant from an adjacent implant 12. The implants 12A-12D and the underlying absorber layer 14 form the collection diodes 408A-408D, respectively, which are similar in construction to the collection diodes 208 described above. Metal traces 411A-411D interconnect the collection diodes 408A-408D to metal pads 422A-422D, respectively. In a preferred embodiment, the radial distance of the collection diodes 408 from the center C is matched to the expected optical spot size, such as calculated as shown in FIG. 7C.

Figure 8B:
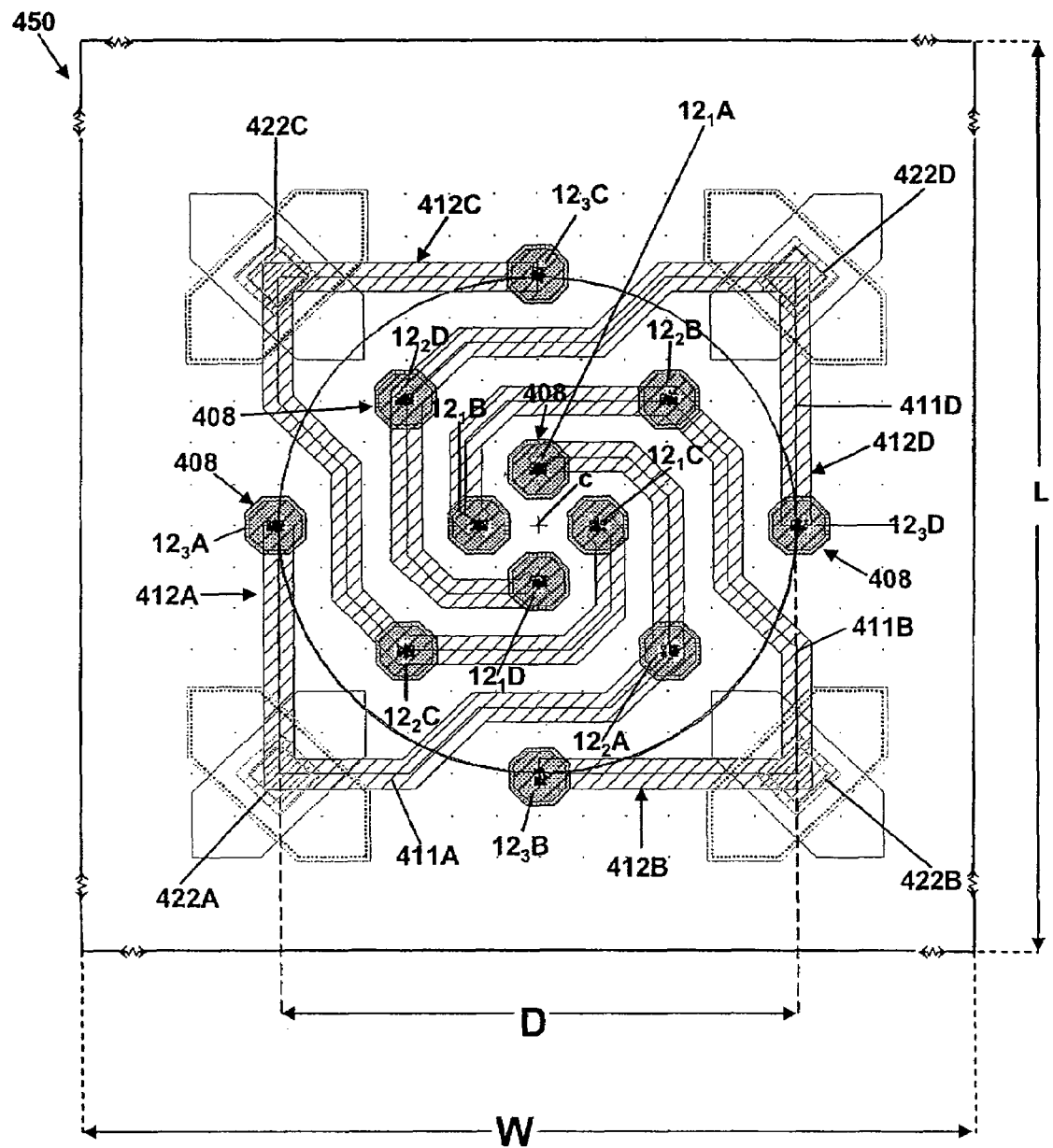
FIG. 8B is a top down plan view of a pixel including four interdigitated sub-detectors in accordance with another preferred embodiment of the present invention.

FIG. 8B is a top down plan view of a preferred microlens pixel 450, in accordance with the present invention, including four interdigitated sub-detectors 412A-412D. The pixel 450, like the pixel 400 of FIG. 8A, receives optical energy through a microlens (not shown), and the sub-detectors 412 are interdigitated in accordance with the expected locations on the pixel 450 that the optical energy focused by the microlens would be absorbed. The positions of the implants 12 are arranged over the horizontal portion of the pixel 450 so that the collection diodes 408 of each of the sub-detectors 412 cover a relatively large area of the expected optical spot. Like the pixel 400, the pixel 450 corresponds to a horizontal portion having a width W and a length L, each of which is about 120 μm. The pixel 450 includes sets of implants $12_1$A-$12_1$D, $12_2$A-$12_2$D and $12_3$A-$12_3$D, where an implant 12 from each of the implant sets $12_i$ constitutes a collection diode 408 of a distinct sub-detector 412 in the pixel 450. The implants 12 of the respective implant sets $12_1$, $12_2$ and $12_3$ are interdigitated in a symmetric manner about the center C of the pixel 450, and each of the implant sets $12_i$ is at a different radial distance from the center C of the pixel 450. In a preferred embodiment, the implants of the implant sets $12_1$, $12_2$ and $12_3$ are preferably about 7 μm, 15 μm and 30 μm from the center C, respectively, and substantially cover the horizontal portion of the pixel 450 corresponding to the expected optical spot. A metal trace 411 interconnects with a collection diode 408 of each of the implants sets $12_1$, $12_2$ and $12_3$ to form a sub-detector 412 that, starting from adjacent the center C, follows a substantially spiraling configuration. Referring to FIG. 8B, the sub-detector 412A includes the collection diodes 408 formed by implants $12_1$A, $12_2$A and $12_3$A; the sub-detector 412B includes the collection diodes 408 formed by implants $12_1$B, $12_2$B and $12_3$B; the sub-detector 412C includes the collection diodes 408 formed by implants $12_1$C, $12_2$C and $12_3$C; and the sub-detector 412D includes the collection diodes 408 formed by implants $12_1$D, $12_2$D and $12_3$D. The interconnection of collection diodes 408, which are at different radial distances from the center C of the pixel 450 and follow a substantially spiraling configuration, provides that the sub-detectors 412A-412D have a substantially circular shape and are interdigitated with a spiraling symmetry starting from C. As in the pixel 400, the metal traces 411A-411D in the pixel 450 interconnect the collections diode 408 of the respective sub-detectors 412A-412D to metal pads 422A-422D, respectively.

In a preferred embodiment, the sub-detectors in an inventive microlens pixel, such as the pixel 450, are interdigitated to match any microlens configuration, such as square or rectangular.

Referring to FIG. 8B, the geometrical features of a microlens pixel including interdigitated sub-detectors in accordance with the present invention, such as the pixel 450, can be used to compute the expected optical response, or collection efficiency, of the pixel 450 where zero, one, two, or three sub-detectors are deselected. For example, the computation can be performed using a Monte-Carlo simulation technique where: (1) the proper statistical distribution of the photons arriving at the absorber layer of the pixel is chosen by random numbers; (2) the number of photons absorbed at an appropriate depth in the absorber layer, thereby generating photogenerated minority charge carriers, is chosen by random numbers; and (3) it is assumed that each of the minority charge carriers diffuses for an appropriate lifetime and with an appropriate diffusion coefficient to determine its fate. Potential fates for the minority carriers are collection by one of the collection diodes or recombination with a majority carrier, either in the bulk of the absorber layer or at a surface.

Figure 9:
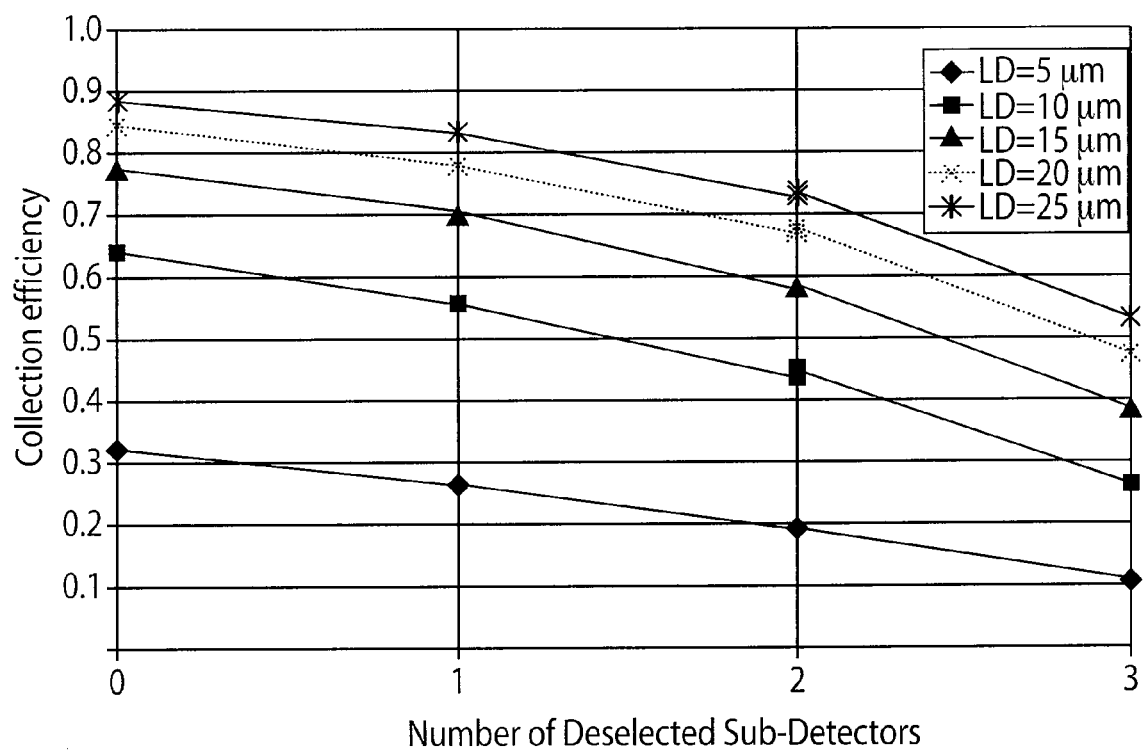
FIG. 9 is a graph illustrating the expected collection efficiency for the pixel of FIG. 8B as a function of deselected sub-detectors and the diffusion length of minority charge carriers.

FIG. 9 is a graph illustrating the results of a Monte-Carlo computation of expected collection efficiency for the pixel 450 as a function of deselected sub-detectors at various diffusion lengths LD. Referring to FIG. 9, for a diffusion length equal to 25 µm, deselecting a single sub-detector of the pixel 450 reduces the collection efficiency by only about 6%, which is an improvement over the 25% reduction in collection efficiency that would be expected if all of the photogenerated minority charges from the otherwise inoperable (deselected) sub-detector are lost for use in generating imaging data. Table 1 below sets forth expected reductions in collection efficiency as a function of the number of deselected sub-detectors for the pixel 450 where LD=25 µm and LD=15 µm.

TABLE 1

| Number of Deselected Sub-detectors | LD = 15 µm | LD = 25 µm |
|---|---|---|
| 1 | 9% | 6% |
| 2 | 25% | 17% |
| 3 | 50% | 40% |

Although preferred embodiments of the present invention have been described and illustrated, it will be apparent to those skilled in the art that various modifications may be made without departing from the principles of the invention.

We claim:

1. A pixel for use in a detector array of a focal plane array imager, the pixel comprising:
   a plurality of minority charge collectors arranged in an array having at least four rows and at least four columns,
   a first metal trace electrically connecting a first plurality of non-adjacent collectors in a first of the rows to a first plurality of non-adjacent collectors in a third of the rows to define a first interdigitzed sub-detector;
   a second metal trace electrically connecting a first plurality of non-adjacent collectors in a second of the rows to first plurality of non-adjacent collectors in a fourth of the rows to define a second interdigitzed sub-detector;
   a third metal trace electrically connecting a second plurality of non-adjacent collectors in the first row to a second plurality of collectors in the third row to define a third interdigitzed sub-detector; and
   a fourth metal trace electrically connecting a second plurality of non-adjacent collectors in the second row to a second plurality of collectors in the fourth row to define a fourth interdigitzed sub-detector;
   wherein each of the minority charge collectors is included in no more than a single one of the sub-detectors, each of the sub-detectors is selectively operable (i) in a selected mode to collect minority charges and (ii) in a deselected mode to act as an open circuit, and wherein the sub-detectors are interdigitated in the pixel such that, if one of the sub-detectors is deselected, the remaining sub-detectors in the pixel, when selected, collect approximately 91 percent or more of minority charges generated in the pixel resulting from absorption of optical energy in the pixel that would have been collected if each of the sub-detectors had been selected.

2. The pixel of claim 1, wherein the minority charge collectors are at least one of a p/n junction collection diode and a n/p junction collection diode.

3. The pixel of claim 1, wherein the optical energy is infrared energy.

4. The pixel of claim 1, wherein the sub-detectors are interdigitated according to at least one of expected optical spot distribution, expected diffusion length of minority charge carriers generated from the absorbed optical energy and probability of collection of the minority charges by the collectors based on locations of the collectors in the pixel in relation to locations of optical energy absorption in the pixel.

5. The pixel of claim 1, wherein the first, second, third and fourth metal traces are formed from a first metal layer.

6. The pixel of claim 1, wherein the array of collectors are arranged in four rows by four columns, and the first sub-detector includes the collectors (1,1), (1,3), (3,1) and (3,3) of the array, the second sub-detector includes the collectors (1,2), (3,2), (1,4) and (3,4) of the array, the third sub-detector includes the collectors (2,1), (4,1), (2,3) and (4,3) of the array and the fourth sub-detector includes the collectors (2,2), (4,2), (2,4) and (4,4) of the array.

7. A focal plane array ("FPA") in an infrared imager, wherein the FPA contains a plurality of pixels, wherein each of the pixels comprises:
   a plurality of minority charge collectors arranged in an array having at least four rows and at least four columns;
   a first metal trace electrically connecting a first plurality of non-adjacent collectors in a first of the rows to a first plurality of non-adjacent collectors in a third of the rows to define a first interdigitzed sub-detector;
   a second metal trace electrically connecting a first plurality of non-adjacent collectors in a second of the rows to first plurality of non-adjacent collectors in a fourth of the rows to define a second interdigitzed sub-detector;
   a third metal trace electrically connecting a second plurality of non-adjacent collectors in the first row to a second plurality of collectors in the third row to define a third interdigitzed sub-detector; and
   a fourth metal trace electrically connecting a second plurality of non-adjacent collectors in the second row to a second plurality of collectors in the fourth row to define a fourth interdigitzed sub-detector;
   wherein each of the minority charge collectors is included in no more than a single one of the sub-detectors, each of the sub-detectors is selectively operable (i) in a selected mode to collect minority charges and (ii) in a deselected mode to act as an open circuit, and
   wherein the sub-detectors are interdigitated in the pixel such that, if one of the sub-detectors is deselected, the remaining sub-detectors in the pixel, when selected, collect approximately 91 percent or more of minority charges generated in the pixel resulting from absorption of optical energy in the pixel that would have been collected if each of the sub-detectors had been selected.

8. The imager of claim 7, wherein the sub-detectors in each of the pixels are interdigitated according to at least one of expected optical spot distribution, expected diffusion length of minority charge carriers generated from the absorbed optical energy and probability of collection of the minority charges by the collectors based on locations of the collectors in the pixel in relation to locations of optical energy absorption in the pixel.

9. A method of imaging a scene comprising:

providing a focal plane array ("FPA") including a plurality of pixels, wherein each of the pixels in the FPA includes: a plurality of minority charge collectors arranged in an array having at least four rows and at least four columns; a first metal trace electrically connecting a first plurality of non-adjacent collectors in a first of the rows to a first plurality of non-adjacent collectors in a third of the rows to define a first interdigitzed sub-detector; a second metal trace electrically connecting a first plurality of non-adjacent collectors in a second of the rows to first plurality of non-adjacent collectors in a fourth of the rows to define a second interdigitzed sub-detector; a third metal trace electrically connecting a second plurality of non-adjacent collectors in the first row to a second plurality of collectors in the third row to define a third interdigitzed sub-detector; and a fourth metal trace electrically connecting a second plurality of non-adjacent collectors in the second row to a second plurality of collectors in the fourth row to define a fourth interdigitzed sub-detector; wherein each of the minority charge collectors is included in no more than a single one of the sub-detectors, each of the sub-detectors is selectively operable (i) in a selected mode to collect minority charges and (ii) in a deselected mode to act as an open circuit, operating one of the sub-detectors in the FPA having an inoperable minority charge collector in the deselected mode and operating all other sub-detectors in the selected mode; and for each of the pixels in the FPA, collecting at the sub-detectors operating in selected mode approximately 91 percent or more of minority charges generated resulting from absorption of optical energy in the pixel that would have been collected if each of the sub-detectors had been selected.

10. The method of claim 9, further comprising: for each of the pixels in the FPA, after an integration interval, summing the minority charges collected at the sub-detectors operating in selected mode.

11. The method of claim 9, wherein the minority charge collectors are at least one of a p/n junction collection diode and a n/p junction collection diode.

12. The method of claim 9, wherein the optical energy is infrared energy.

* * * * *